United States Patent
Shigeoka et al.

(10) Patent No.: US 8,669,502 B2
(45) Date of Patent: Mar. 11, 2014

(54) OPERATION DEVICE AND HEATING COOKER USING OPERATION DEVICE

(75) Inventors: Takehiko Shigeoka, Nara (JP); Takaaki Kusaka, Hyogo (JP); Akira Kataoka, Shiga (JP); Eiji Matsui, Osaka (JP)

(73) Assignee: Panasonic Corporation, Osaka (JP)

( * ) Notice: Subject to any disclaimer, the term of this patent is extended or adjusted under 35 U.S.C. 154(b) by 150 days.

(21) Appl. No.: 13/386,969

(22) PCT Filed: Jul. 22, 2010

(86) PCT No.: PCT/JP2010/004687
§ 371 (c)(1),
(2), (4) Date: Jan. 25, 2012

(87) PCT Pub. No.: WO2011/013330
PCT Pub. Date: Feb. 3, 2011

(65) Prior Publication Data
US 2012/0118714 A1    May 17, 2012

(30) Foreign Application Priority Data

Jul. 27, 2009   (JP) .................................. 2009-174072
Jan. 13, 2010   (JP) .................................. 2010-004724

(51) Int. Cl.
*H05B 1/02*         (2006.01)

(52) U.S. Cl.
USPC ........ 219/502; 219/412; 219/459.1; 219/507; 361/437

(58) Field of Classification Search
CPC ................................ H05B 1/02; H05B 1/0266
USPC ......... 219/412–414, 483, 494, 497, 505, 715, 219/716, 507; 361/679.02, 437
See application file for complete search history.

(56) References Cited

U.S. PATENT DOCUMENTS

| 4,121,204 A | 10/1978 | Welch et al. |
| 4,266,118 A * | 5/1981 | Takase et al. ................. 219/492 |
| 7,335,861 B2 * | 2/2008 | Gama et al. ................... 219/506 |

(Continued)

FOREIGN PATENT DOCUMENTS

| CN | 101393480 A | 3/2009 |
| JP | 53-95283 | 8/1978 |

(Continued)

OTHER PUBLICATIONS

International Preliminary Report on Patentability for International Application No. PCT/JP2010/004687, dated Feb. 16, 2012, 6 pages.

(Continued)

*Primary Examiner* — Mark Paschall
(74) *Attorney, Agent, or Firm* — Brinks Gilson & Lione

(57) ABSTRACT

The present invention provides an operation device which has a stable operation feeling with a simple configuration and has a high reliability and an excellent operability. An electrode terminal portion which is arranged just below an operation region on a top plate made of a material having an electric insulating property, and serves as an electrostatic capacity type touch switch has a detection portion which comes into close contact with a back surface of the operation region, a spring portion which has an elastic force pressing the detection portion to the back surface of the top plate, and a slide portion which is movably retained in the guide holder.

26 Claims, 13 Drawing Sheets

(56) References Cited

U.S. PATENT DOCUMENTS

| | | |
|---|---|---|
| 8,164,030 B2* | 4/2012 | Isoda et al. .................... 219/489 |
| 2009/0079698 A1* | 3/2009 | Takashima et al. ........... 345/169 |
| 2009/0103250 A1 | 4/2009 | Takashima et al. |

FOREIGN PATENT DOCUMENTS

| | | |
|---|---|---|
| JP | 10-214677 A | 8/1998 |
| JP | 2003-272816 A | 9/2003 |
| JP | 2005-038739 A | 2/2005 |
| JP | 2008-108555 A | 5/2008 |

OTHER PUBLICATIONS

International Search Report for International Application No. PCT/JP2010/004687, dated Sep. 28, 2010, 1 pages.

* cited by examiner

US 8,669,502 B2

OPERATION DEVICE AND HEATING COOKER USING OPERATION DEVICE

This application is a 371 application of PCT/JP2010/004687 having an international filing date of Jul. 22, 2010, which claims priority to JP2009-174072 filed Jul. 27, 2009 and JP2010-004724 filed Jan. 13, 2010, the entire contents of which are incorporated herein by reference.

TECHNICAL FIELD

The present invention relates to an operation device using an electrostatic capacity type touch switch, and more particularly to an operation device used in a heating cooker in which an operation region is formed on a top plate for placing an object to be heated thereon.

BACKGROUND ART

In a conventional heating cooker, an induction heating cooker utilizing an electromagnetic induction is configured to have a casing which accommodates an induction heating coil and a heater which serve as heating sources, as well as an inverter circuit and a control circuit which drive and control these heating sources and the like, and a flat top plate which is provided on the casing and is made of a heat-resistant glass.

A cooking container or the like as an object to be heated and cooked is placed on the top plate in the heating cooker so as to be heated. The cooking container such as a pan is placed at a predetermined position on the top plate, for example, a position which is indicated by a circular mark on the top plate. The induction heating coil and the heater are provided just below the top plate on which the circular mark is indicated. The general heating cooker is configured such that it can simultaneously heat a plurality of cooking containers, for example, three cooking containers, and the circular marks are indicated at the respective heating positions on the top plate.

Operation switches which are operated by a user for an on and off control of a heating operation in the heating cooker, operation switches which are operated by the user for a regulation of a heating calorie and the like, a display lamp and a display mark indicating a used situation of the heating cooker, and the like are provided in a region of a front surface (close to a user) of the top plate, in the light of a usability and a design characteristic. Particularly, as the operation switches which are operated by the user, there has been a configuration in which the electrostatic capacity type touch switch can be operated by touching on the top plate. The electrostatic capacity type touch switch is configured such that a change of an electrostatic capacity of a detecting portion is converted into an operation signal, and is hereinafter abbreviated to an electrostatic touch switch.

As the electrostatic touch switch used in the heating cooker, a configuration thereof has been variously improved. As one of them, there has been an example in which a flat-shaped electrode made of a copper foil is provided on a substrate, and the flat-shaped electrode is brought into close contact with a back surface of the top plate, and is configured as a detecting portion of the electrostatic capacity (for example, refer to Patent Literature 1).

FIG. 16 is a cross sectional view showing an electrostatic touch switch in a conventional heating cooker which is disclosed in Patent Literature 1. In FIG. 16, there is shown a state where a user touches an operation switch region 52 on a surface of a top plate 51 by a finger 53. As shown in FIG. 16, a copper foil flat-shaped electrode 55 formed on an operation circuit board 54 is brought into close contact with a back surface of the top plate 51, and a change of the electrostatic capacity between the flat-shaped electrode 55 and the finger of the user is detected. Accordingly, the flat-shaped electrode 55 serves as the detection portion.

FIG. 17 is an electric circuit diagram showing, as an equivalent circuit, an operation switch serving as an electrostatic touch switch in a conventional heating cooker shown in FIG. 16, and showing a detection circuit for detecting an operation state of the operation switch.

As shown in FIG. 17, the user touches the operation switch region 52 on the surface of the top plate 51 with the finger 53, whereby a capacitor is formed equivalently between the finger 53 and the flat-shaped electrode 55 which is made of the copper foil on the operation circuit board 54, as shown by a broken line in the electric circuit diagram in FIG. 17. Accordingly, the capacitor which is configured by the flat-shaped electrode 55 and the finger 53 through the top plate 51 is charged through a resistance 56 from a power supply. As a result, a non-inverting input terminal (+terminal) of a comparator 57 is changed to a low level (L) from a high level (H) only for a short time. At this time, an output terminal of the comparator 57 changes to the low level (L), an operation signal is output to the control circuit, and on and off of a heating operation of the heating cooker and a control of a regulation of heating calorie are carried out.

As mentioned above, by the operation of the operation switch serving as the electrostatic touch switch, an input voltage to the comparator 57 is changed, and the comparator 57 detects the input voltage so as to output the operation signal to the control circuit. As mentioned above, the comparator 57 is a signal processing portion which processes the signal from the operation switch.

Further, as another electrostatic capacity type touch switch which is used in the conventional heating cooker, there has been an example in which a touch switch is configured by forming a conductive thin film as a detecting portion on a back surface of a top plate (for example, refer to Patent Literature 2).

FIG. 18 is an exploded perspective view which shows in an enlarged manner the periphery of an operation switch region in the conventional heating cooker disclosed in Patent Literature 2. A conductive thin film made of a metal material is attached to a back surface of a top plate 61 shown in FIG. 18. A part of the top plate 61 is provided with a touch operation portion 62 for regulating an output of an induction heating coil. The touch operation portion 62 is provided with an electrostatic capacity type touch switch 64 which has a touch detection electrode 63 configured by a part of the conductive thin film. The touch detection electrode 63 is electrically connected to a connecting line 65 and a conductive electrode terminal 66 which are formed on a back surface of the top plate 61 in accordance with a pattern formation. The conductive electrode terminal 66 is brought into contact with a leaf spring 67 which is made of a conductive material so as to be connected to the control circuit.

Further, in the conventional heating cooker disclosed in Patent Literature 2, it is configured such that a part of the touch switch 64 which is provided just below the top plate 61 shines for improving an operability of the electrostatic capacity type touch switch 64.

FIG. 19 is a plan view showing the touch switch 64 in the operation switch region in the conventional heating cooker which is disclosed in Patent Literature 2. FIG. 20 is a cross sectional view of a substantial part in the touch switch 64 of the conventional heating cooker which is disclosed in Patent Literature 2.

As shown in FIG. 19, the operation switch region in the conventional heating cooker is provided with a contact portion 68 in which a transmission portion 69 transmitting a light therethrough is formed such that a sign or a letter indicating an operation content of the touch switch 64 shines. In the contact portion 68 shown in FIG. 19, there are formed by the transmission portion 69 a display mark indicating the right and left directions for regulating a calorie, and a display mark for operating an on and off control of a heating operation. In the display mark indicating the right and left directions for regulating the calorie, a direction is indicated by a position of an apex of an isosceles triangle, the left touch switch 64 indicates a left direction, and the right touch switch 64 indicates a right direction. Further, in the display mark for operating the on and off control of the heating operation, the left touch switch 64 is an ON operation switch, and the right touch switch 64 is an OFF operation switch.

As shown in FIG. 20, in a main body 71 of the heating cooker, an LED 70 serving as a light emitting light source is arranged just below each of the contact portions 68. An electric conductive coating is printed on the contact portion 68, and the transmission portion 69 is formed such that the light transmits without printing the electric conductive coating. Accordingly, in the contact portion 68 of the touch switch 64, the display mark indicating the operation content is formed by printing the electric conductive coating. The light from the LED 70 which exists just below the contact portion 68 passes through an opening portion of the touch detection electrode 63 and the top plate 61, and irradiates a back surface of the contact portion 68. As a result, it is configured such that the light passes through the transmission portion 69 of the contact portion 68, and the user can recognize the position and the operation content of the contact portion 68.

A plurality of LED 70 respectively corresponding to a plurality of contact portions 68 are each mounted on the circuit board 72. A light shielding portion 73 serving as a partition wall is provided in the periphery of each of the LED 70, so that the light from each of the LED 70 irradiates the contact portion 68 which is arranged thereabove. The light shielding portion 73 serving as the partition wall is fixed onto the circuit board 72, and is extended toward the back surface of the top plate 61. In this case, a top plate side end portion of the light shielding portion 73 is arranged so as to have a gap from the back surface of the top plate.

Further, a leaf spring 74 is provided in the circuit board 72, and the touch detection electrode 63 and the detection circuit of the circuit board 72 are electrically connected through the leaf spring 74.

Patent Literature 1: Japanese Unexamined Patent Publication No. 10-214677

Patent Literature 2: Japanese Unexamined Patent Publication No. 2005-38739

SUMMARY OF INVENTION

Technical Problem

In the conventional heating cooker shown in FIG. 16, the flat-shaped electrode 55 made of the copper foil is configured as the detection portion on the operation circuit board 54. The flat-shaped electrode 55 is arranged on the back surface of the top plate 51 so as to be opposed to the operation switch region 52. Since the top plate 51 and a plurality of flat-shaped electrodes 55 on the operation circuit board 54 are separately formed, there is a case that a distance between the top plate 51 and each of the flat-shaped electrodes 55 varies. In the case that the distance between the top plate 51 and each of the flat-shaped electrodes 55 varies, a change of the electrostatic capacity in each of the flat-shaped electrodes 55 is differentiated even by carrying out the same operation. Therefore, the user has an uncomfortable feeling in each of the operations in the operation switch region, and a problem is generated in an operability.

In the conventional heating cooker, it is very hard in terms of its configuration to accurately arrange the flat-shaped electrode 55 at a position corresponding to the contact portion of the operation switch region 52 on the top plate 51, when mounting the top plate 51 on the main body upon assembling and maintenance, and if the opposed state between the contact portion and the flat-shaped electrode 55 is changed in each case, there has been such a problem that an operation feeling is different in each of the contact portions.

Further, in the conventional heating cooker, in the case of assembling so as to securely bring the flat-shaped electrode 55 into surface contact with the back surface of the top plate 51, there is such a problem that the configuration becomes complicated, and a working process is increased.

Further, in the conventional heating cooker shown in FIG. 18, as the detection portion of a plurality of electrostatic capacity type touch switches 64, the conductive thin film is configured by pattern printing on the back surface of the top plate 61. In the conventional heating cooker as mentioned above, it is necessary to print the pattern of the conductive thin film for forming the touch detection electrode 63, the connecting line 65 and the conductive electrode terminal 66 on the back surface of the top plate 61. However, since the top plate 61 is large in shape and is a heavy material, it is not an easy work to print the conductive thin film on the top plate 61, and a lot of working processes are necessary for pattern forming the conductive thin film on the top plate 61, so that there has been such a problem that a manufacturing cost becomes high. Further, since the hard works mentioned above are carried out, the conventional heating cooker has had such a problem that a defect occurrence rate becomes high.

Further, as shown in FIG. 18, in the conventional heating cooker, the conductive electrode terminal 66 made of the conductive thin film on the back surface of the top plate 61 comes into contact with the leaf spring 67 and is connected to the detection circuit of the circuit board. Accordingly, if a vibration such as an impact or the like is applied to the heating cooker, there has been such a problem that the conductive electrode terminal 66 which is brought into contact with the leaf spring 67 is rubbed so as to be peeled off.

Particularly, since the induction heating cooker accompanies a vibration during a heating operation, the conductive electrode terminal 66 which comes into contact with the leaf spring 67 has a high chance of peeling off. If the conductive electrode terminal 66 of the conductive thin film peels off, an operation feeling is greatly changed, and an operation inability is caused in some cases. In order to suppress a generation of the peeling state mentioned above, there is considered such a matter that a contact area is made smaller by rounding the leaf spring 67 at the position which comes into contact with the conductive electrode terminal 66. However, if the contact area is made smaller, there has been such a problem that the contact resistance varies and the operation feeling is different in each of the contact portions.

Further, in the conventional heating cooker shown in FIG. 20, since the light shielding portion 73 provided on the circuit board 72 and the top plate 61 are separately configured, there is a possibility that the distance between the top plate side end portion which corresponds to the upper end of the light shielding portion 73 and the back surface of the top plate 61 varies. If the distance between the upper end of the light shielding portion 73 and the back surface of the top plate 61 becomes large, the light from the LED 70 serving as the light source leaks to the adjacent region, and there is such a problem that it irradiates the other regions than the intended region. If the other regions than the intended region is irradiated, the light transmits through the transmission portion 69 (the adjacent touch switch) of the contact portion 68 existing in the region which is not intended, there has been such a problem that an outer appearance is deteriorated, an appearance quality of a product falls away, and an erroneous operation is caused.

An object of the present invention is to provide an operation device which has a stable operation feeling with a simple configuration and has a high reliability and an excellent operability, so that it can be used also as an operation device in various equipment, as well as solving various problems in the operation device which is used in the conventional heating cooker.

Solution to Problem

An operation device of a first aspect according to the present invention is an operation device comprising:

an electrode terminal portion which is arranged just below an operation region (corresponding to an operation switch region in an embodiment mentioned below) on a top plate made of a material (a dielectric material) having an electric insulating property, and serves as an electrostatic capacity type touch switch;

a guide holder which slidably holds the electrode terminal portion; and an operation substrate which is provided with the guide holder, wherein the electrode terminal portion has a detection portion which comes into close contact with a back surface of the operation region, a spring portion which has an elastic force pressing the detection portion to the back surface of the operation region, and a slide portion which is movably retained in the guide holder, moves together with the detection portion due to the elastic force of the spring portion, and presses the detection portion to the back surface of the operation region, and wherein the detection portion, the spring portion and the slide portion are integrally formed, and a change of an electrostatic capacity in the electrode terminal portion is configured to be output as an operation signal.

The slide portion of the electrode terminal portion is movably retained by the guide holder, and the detection portion of the electrode terminal portion expands and contracts due to the elastic force by the spring portion, whereby the operation device of the first aspect according to the present invention which is configured as mentioned above is stably and securely brought into close contact with the back surface of the operation region on the top plate. Accordingly, when the top plate is mounted on the main body upon assembling and maintenance, the distance between the detection portion of the electrode terminal portion and the back surface of the top plate does not vary.

In an operation device of a second aspect according to the present invention, it may be configured such that the detection portion of the electrode terminal portion of the first aspect has a flat surface which is in parallel to the back surface of the operation region on the top plate, and forms a top surface of the electrode terminal portion, and that the spring portion and the slide portion are formed in each of both side surfaces of the electrode terminal portion so as to support both sides of the detection portion, and the slide portion is movably retained in the guide holder at a time when the slide portion and the detection portion move due to the elastic force of the spring portion, and the detection portion comes into contact with the back surface of the top plate.

In the operation device of the second aspect according to the present invention, the electrode terminal portion is configured to be retained by the guide holder by arranging the spring portion and the slide portion which expand and contract in an upward and downward direction respectively in both side surfaces of the electrode terminal portion, so as to pinch the detection portion which is formed in the top surface. Accordingly, in the operation device of the second aspect according to the present invention, the detection portion is pressed to the back surface of the operation region from both sides, and the detection portion more stably and securely contacts closely to the back surface of the operation region.

Particularly, in the case that the detection portion is supported on one side upon assembling and maintenance, there is fear that the detection surface of the detection portion is inclined so as to come into contact in a biased manner due to somewhat deformation of the electrode terminal portion, and only a part of the detection surface comes into contact with the back surface of the operation region. However, in the operation device of the second aspect according to the present invention, the detection portion is supported on both sides, and the detection portion is supported by the spring portion which expands and contracts in the upward and downward direction. Accordingly, it is possible to arrange the detection portion while having a margin of a stroke of the expanding and contracting spring portion, and there is no fear that the detection surface of the detection portion comes into biased contact with the back surface of the operation region. As a result, a whole surface of the detection surface of the electrode terminal portion contacts closely to the back surface of the operation region on the top plate, and it is possible to widely reduce a defect generation.

In the operation device of a third aspect according to the present invention, the guide holder of the first or second aspect may be configured such that a hole having an opening is formed in the top surface which is located at a position opposed to the back surface of the top plate, a light emitting element is arranged in the hole of the guide holder, a light from the light emitting element irradiates the detection portion of the electrode terminal portion, and the light transmits from at least a part of the operation region on the top plate.

In the operation device of the third aspect according to the present invention which is configured as mentioned above, the light emitting element is arranged in the guide holder, and the light from the light emitting element irradiates the back surface of the operation region on the top plate through the detection portion of the electrode terminal portion. Accordingly, the operation region on the top plate becomes definite, and it is possible to prevent the object to be heated such as the pan or the like from being placed on the operation region upon a heating operation, which will otherwise reach a high temperature. Further, since the light from the light emitting element transmits the operation region on the top plate, the user can easily identify the operation region, and it is possible to improve an operability.

In an operation device of a fourth aspect according to the present invention, it may be configured such that a light shielding portion is provided between the detection portion of the electrode terminal portion and the guide holder, and the light shielding portion is movably retained to the guide holder, and moves together with the detection portion.

In the operation device of the fourth aspect according to the present invention which is configured as mentioned above, since the light shielding portion is provided in the electrode portion of the operation portion, the light does not leak to the other regions than the specific region to which the light should be applied, an outer appearance is not deteriorated as a product having no appearance quality, and there is no fear that an erroneous operation is caused.

In an operation device of a fifth aspect according to the present invention, it may be configured such that a name plate having an individual simple character shaped light transmission portion indicating an operation content of a touch switch is attached to the top surface opening of the guide holder of the third aspect, the name plate is irradiated by the light from the light emitting element in the hole of the guide holder, and the character shape of the light transmission portion is displayed in the operation region on the top plate through the opening which is formed in the detection portion of the electrode terminal portion.

In the operation device of the fifth aspect according to the present invention which is configured as mentioned above, since the name plate having the individual simple character shaped light transmission portion indicating the operation content of the touch switch is irradiated by the light emitting element, the user can more easily identify the operation content and it is possible to improve an operability.

Further, in the operation device of the fifth aspect according to the present invention, since the name plate having the individual simple character shaped light transmission portion indicating the operation content is attached to the top surface opening of the guide holder, it is possible to prevent a heat conduction from the top plate which allows the object to be heated to be placed thereon and thus reaches a high temperature, and it is possible to reduce a thermal effect to the operation substrate on which the light emitting element and the like are mounted.

In an operation device of a sixth aspect according to the present invention, a simple character shaped opening indicating the operation content may be formed in the detection portion which is formed in the top surface of the electrode terminal portion of the third aspect.

In the operation device of the sixth aspect according to the present invention which is configured as mentioned above, the name plate having the individual simple character shaped light transmission portion indicating the operation content is not required, so that a configuration becomes simple, and there is no fear of a displacement between the name plate and the detection portion of the electrode terminal portion. Further, since the opening in which the character shape is formed in the detection portion contacts closely to the back surface of the operation region on the top plate, it is not affected by a peripheral structure or the like, and a shadow is not generated, so that a character shaped chip which tends to be generated at a time when the user views from a diagonal direction does not appear, and a visibility is improved.

In an operation device of a seventh aspect according to the present invention, the light emitting element of the third aspect may be configured by arranging a plurality of LED which generate a plurality of colors, or LED which generate different colors, and may be configured to change the color generation of the light emitting element in correspondence to an operation state by the operation of the touch switch.

In the operation device of the seventh aspect according to the present invention which is configured as mentioned above, since the color generation of the light emitting element is changed in correspondence to the operation state by the operation of the touch switch, it is possible to improve a visibility which is more visual for the user, and a usability is further improved.

In an operation device of an eighth aspect according to the present invention, a diffusion sheet diffusing the light may be attached to the top surface of the guide holder of the third aspect.

In the operation device of the eighth aspect according to the present invention which is configured as mentioned above, the light from the light emitting element is diffused in the diffusion sheet, passes through the opening of the detection portion, and uniformly irradiates the back surface of the operation switch region. Accordingly, a uniformity of the light indicating the character shape is improved, and it is possible to further definitely display to the user.

In an operation device of a ninth aspect according to the present invention, it may be configured such that an individual character shape indicating the operation content of the touch switch is printed on the back surface of the operation region on the top plate of the third aspect.

In the operation device of the ninth aspect according to the present invention which is configured as mentioned above, such a configuration is obtained which can correspond to various character shapes.

In an operation device of a tenth aspect according to the present invention, a conductive sheet having an individual character shaped light transmission portion indicating the operation content of the touch switch may be attached to the detection portion of the third aspect.

In the operation device of the tenth aspect according to the present invention which is configured as mentioned above, the conductive sheet which is integrated with the detection portion of the electrode terminal portion is configured to have a detection function, and it is easy to make an area of the detection portion equal to or more than a predetermined area so that it is possible to largely receive a change of the electrostatic capacity in the electrode terminal portion.

In an operation device of an eleventh aspect according to the present invention, the light shielding portion and the electrode terminal portion of the fourth aspect may be configured to be connected by an engagement portion so as to integrally move, and the electrode terminal portion may be configured to pinch the light shielding portion.

In the operation device of the eleventh aspect according to the present invention which is configured as mentioned above, it is possible to integrate the light shielding portion and the electrode terminal portion by setting the engagement portion having a simple configuration, and it is possible to make the positions of the detection portion of the electrode terminal portion and the light shielding portion always constant.

In an operation device of a twelfth aspect according to the present invention, a simple character shaped opening indicating the operation content of the touch switch may be formed on the top plate of the light shielding portion of the fourth aspect.

In the operation device of the twelfth aspect according to the present invention which is configured as mentioned above, the name plate displaying the individual simple character shape indicating the operation content is not required, so that the configuration becomes simple, and the configuration for preventing the displacement of the name plate with respect to the light shielding portion or the like is not required.

In an operation device of a thirteenth aspect according to the present invention, an opening in a complex shape putting together a plurality of simple character shapes indicating the operation content of the touch switch may be formed in the detection portion which is formed in the top surface of the electrode terminal of the fourth aspect.

In the operation device of the thirteenth aspect according to the present invention which is configured as mentioned above, since the opening in a complex shape putting together a plurality of simple character shapes indicating the operation content is formed in the detection portion which is formed in the top surface of the electrode terminal portion, it is easy to make the detection portion for largely receiving the change of the electrostatic capacity secure the detection surface having a predetermined area or more, it is not necessary to set the operation region large, and it is possible to set the operation region compact.

A heating cooker of a fourteenth aspect according to the present invention is provided with the operation device of any aspect of the first aspect to the thirteenth aspect, a heating unit which is provided just below the top plate and heats an object to be heated placed on the top plate, and a control portion which controls the heating unit, wherein it is configured such that an operation signal in response to a change of an electrostatic capacity in the electrode terminal portion of the operation device is input to the control portion so as to control the heating unit.

In the fourteenth aspect according to the present invention which is configured as mentioned above, a heating cooker is obtained which has a stable operation feeling with a simple configuration, is high in reliability and has an excellent operability.

Advantageous Effects of Invention

The operation device of the present invention is configured such that the detection portion of the electrode terminal portion and the back surface of the operation portion region stably and securely contact with each other closely. Therefore, the operation device of the present invention can obtain a stable operation feeling and has a high reliability and an excellent operability.

DETAILED DESCRIPTION OF THE PREFERRED EMBODIMENTS

A description will be given of an example which uses an operation device of the present invention as an operation portion of a heating cooker, as an embodiment in accordance with the operation device of the present invention, with reference to the accompanying drawings. In this case, the operation device of the present invention is not limited to a configuration which is used in the heating cooker described in the following embodiments, but can be used as an operation device of various equipment, and is configured based on a technical idea which is equivalent to a technical idea described in the following embodiment and a technical common sense in the technical field.

Embodiment 1

Figure 1:
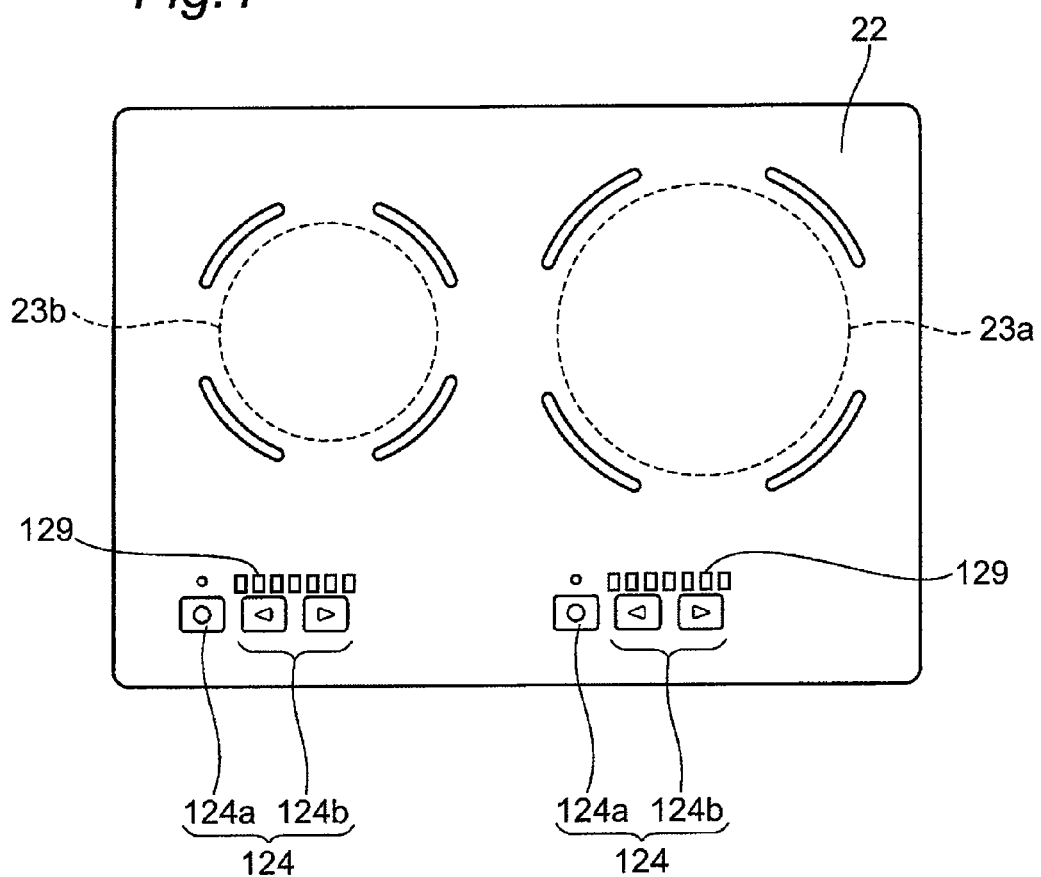
FIG. 1 is a plan view of a heating cooker of an embodiment 1 according to the present invention.
Figure 2:
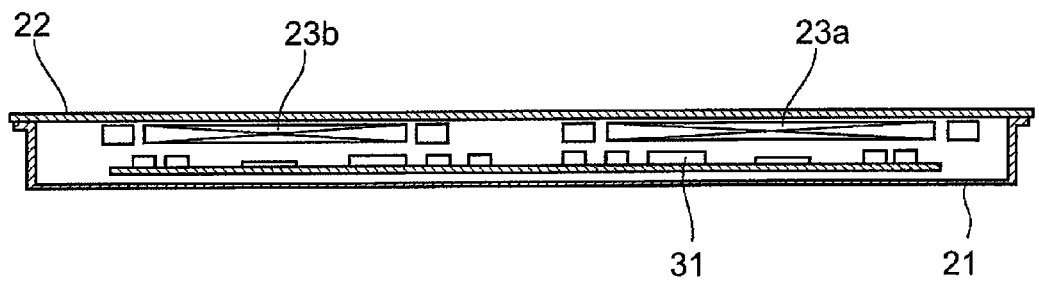
FIG. 2 is a cross sectional view of the heating cooker of the embodiment 1 according to the present invention.

FIG. 1 is a plan view of a heating cooker of an embodiment 1 according to the present invention, and FIG. 2 is a cross sectional view of the heating cooker of the embodiment 1 according to the present invention.

The plan view shown in FIG. 1 shows a top plate 22 having a flat surface which serves as a top surface of a main body 21 (refer to FIG. 2) of the heating cooker of the embodiment 1. In FIG. 1, a position in a lower side of the top plate 22 is a position where a user exists, and a position where the user operates the heating cooker. On the top plate 22, a region closer to the position where the user exists serves as a user side region. An operation switch region 124 and an operation display region 129 which serve as an operation region are formed within the user side region.

The top plate 22 shown in FIG. 1 is made of a heat-resistant glass, for example, a crystallized glass, which is a dielectric material and has an electric insulating property. Two circle patterns displaying a heating position on which a cooking container such as a pan or the like, serving as an object to be heated, is placed are represented in a pseudo manner on the top plate 22. One pseudo circle pattern is formed by four circular arcuate lines. The circle pattern having a large diameter indicates a position corresponding to an induction heating coil of a first heating unit 23a, for example, in which a maximum output is 3 kW, and the circle pattern having a small diameter indicates a position corresponding to an induction heating coil of a second heating unit 23b, for example, in which a maximum output is 2 kW.

In the heating cooker of the embodiment 1, in the main body 21, there are arranged approximately circular induction heating coils in the first heating unit 23a and the second heating unit 23b for heating the cooking container as the object to be heated just below the top plate 22. Outputs of the first heating unit 23a and the second heating unit 23b are controlled by a contact of a finger or the like of a user with an operation switch region 124a and/or a calorie operation switch region 124b of an operation switch region 124 which serves as an operation region on the top plate 22. Just below the operation switch region 124a, there is provided an electrostatic touch switch serving as an electrostatic capacity type touch switch for carrying out an on and off operation of the heating cooker. Further, just below the calorie operation switch region 124b, there is provided an electrostatic touch switch serving as an electrostatic capacity type touch switch for regulating a calorie of the heating cooker.

Further, the operation display region 129 on the top plate 22 is provided with a plurality of display marks so as to indicate a heating calorie, and is configured such that a heating calorie can be regulated visually by changing the lighting number of the display mark. Accordingly, it is configured such that a lighting state of the display mark of the operation display region 129 moves similarly in the right and left directions by coming into contact with the calorie operation switch region 124b indicating the right and left directions, thereby indicating a heating calorie at that time.

Further, a temperature sensor for detecting a temperature of the cooking container is provided just below the top plate 22 in the heating cooker of the embodiment 1. The cooking container which is heated by the first heating unit 23a is detected its temperature by a first temperature sensor (not shown), and the cooking container which is heated by the second heating unit 23b is detected its temperature by a second temperature sensor (not shown). Each of detection signals from the first and second temperature sensors is transmitted to a control portion 31 within the main body 21. The control portion 31 carries out a control with respect to the first heating unit 23a and the second heating unit 23b based on each of the detection signals from the first and second temperature sensors.

Figure 3:
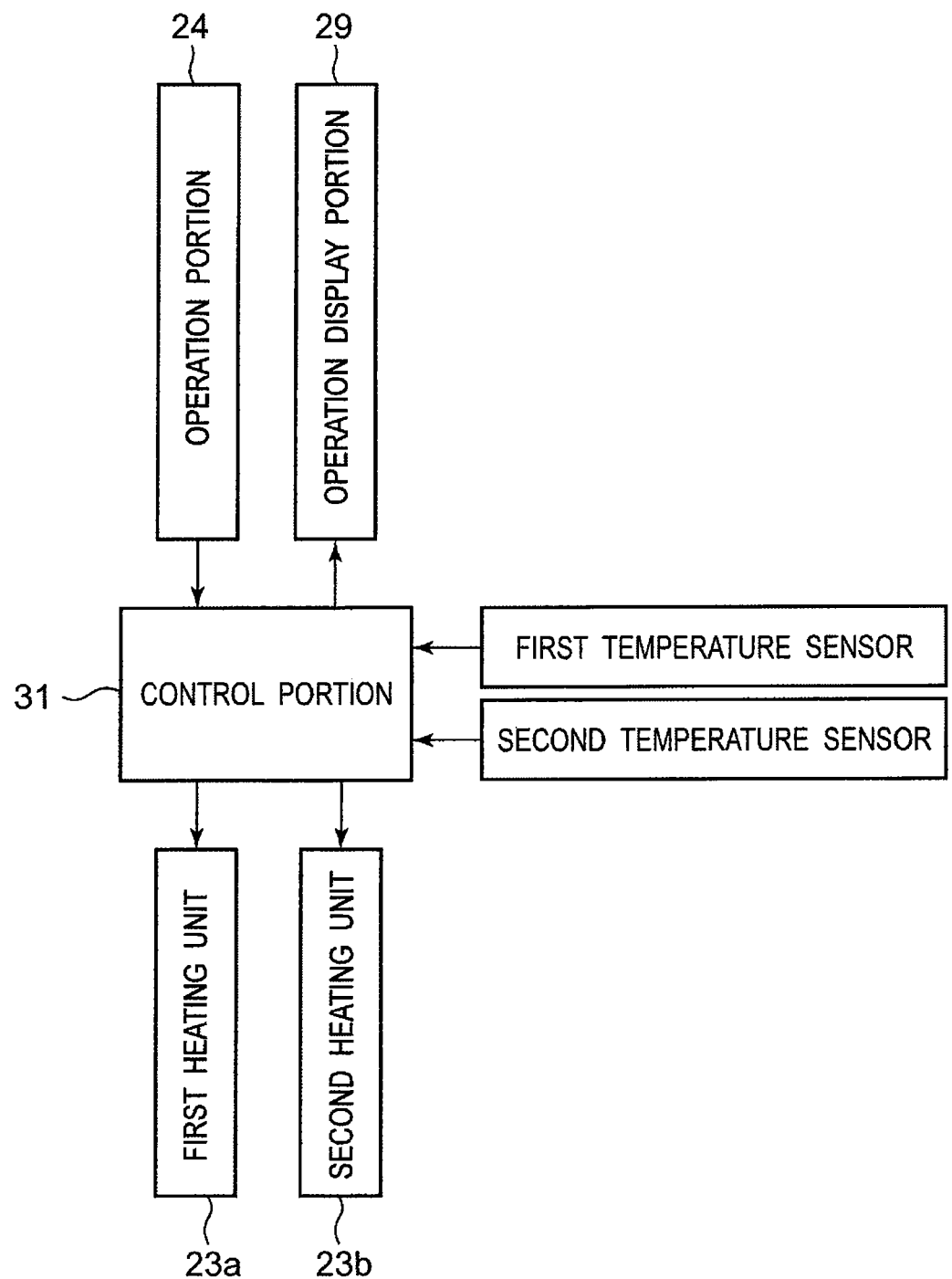
FIG. 3 is a control block diagram of the heating cooker of the embodiment 1 according to the present invention.

FIG. 3 is a control block diagram in the heating cooker of the embodiment 1 according to the present invention. As shown in FIG. 3, the control portion 31 controls so as to drive the first heating unit 23a and the second heating unit 23b based on an operation signal from an operation portion just below an operation switch region 124 which serves as the operation region formed on the top plate 22, the detection signals from the first and second temperature sensors, and the like. Further, the control portion 31 outputs a signal so as to display an operation state at that time in an operation display portion 29 which is provided just below the operation display region 129 formed on the top plate 22.

[Configuration of Electrode Portion of Electrostatic Touch Switch]

In the heating cooker of the embodiment 1, one operation switch electrode portion 24a and two calorie operation switch electrode portions 24b and 24b are provided in the operation portion 24 which is provided just below the operation switch region 124 on the top plate 22. The operation switch electrode portion 24a and the calorie operation switch electrode portion 24b are provided as electrostatic touch switches. A description will be given below of the configurations of the operation switch electrode portion 24a and the calorie operation switch electrode portion 24b.

In the operation switch electrode portion 24a and the calorie operation switch electrode portion 24b in the heating cooker of the embodiment 1, since the configurations serving as the electrode portions of the electrostatic touch switches are basically the same, a description will be given of the configuration of the operation switch electrode portion 24a. In this case, the operation portion 24 in the heating cooker of the embodiment 1 is configured such that the electrode portions of three electrostatic touch switches which are configured by one operation switch electrode portion 24a and two calorie operation switch electrode portions 24b and 24b are provided side by side, and has an integral configuration so as to be unitized.

Figure 4A:
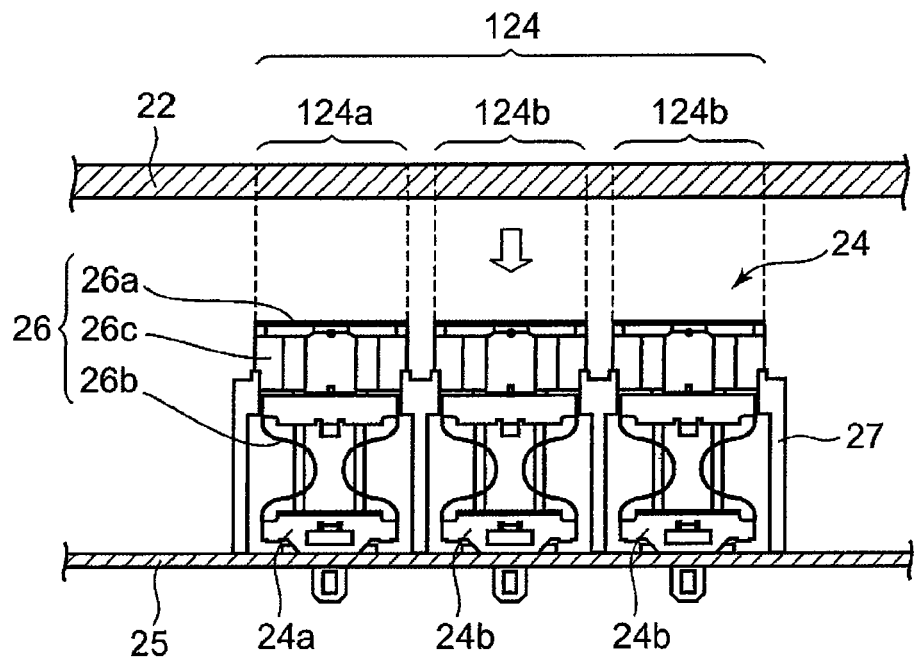
FIG. 4A is a front elevational view showing a state before an operation portion is assembled in the heating cooker of the embodiment 1 according to the present invention.
Figure 4B:
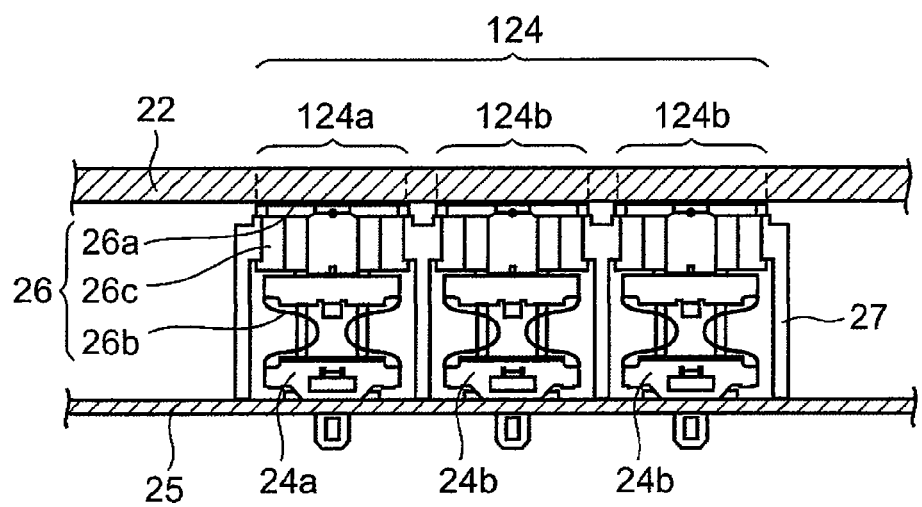
FIG. 4B is a front elevational view showing a state after the operation portion is assembled in the heating cooker of the embodiment 1 according to the present invention.

FIG. 4A is a front elevational view showing one operation switch electrode portion 24a and two calorie operation switch electrode portions 24b and 24b which are provided just below the operation switch region 124 on the top plate 22 in the heating cooker of the embodiment 1, and shows a state before the top plate 22 is mounted on the main body 21. FIG. 4B shows a state where the top plate 22 is mounted on the operation switch electrode portion 24a and the calorie operation switch electrode portion 24b shown in FIG. 4A, and the top plate 22 is fixed to the main body 21.

In the operation switch region 124 which is provided in the surface of the top plate 22, it is configured such that the operation switch electrode portion 24a is arranged just below the operation switch region 124a. The operation switch electrode portion 24a is configured to have an electrode terminal portion 26 serving as a detection electrode of the electrostatic touch switch, and a guide holder 27 which slidably retains the electrode terminal portion 26. The electrode terminal portion 26 is provided with a detection portion 26a which comes into close contact with the back surface of the top plate 22, a slide portion 26c which is integrally formed continuously in the detection portion 26a and slidably engages with the guide holder 27, and a spring portion 26b which has an elastic force pressing the detection portion 26a so as to come into close contact with the back surface of the top plate 22, and is fixed in its one end to the guide holder 27. In other words, the detection portion 26a is pressed against the back surface of the top plate 22 due to the elastic force of the spring portion 26b. The detection portion 26a is integrally made of a metal material with the spring portion 26b and the slide portion 26c, and is configured by a flat surface so as to contact closely to the back surface of the top plate 22. The detection portion 26a is supported on both of a front surface and a back surface by the same configurations as the spring portion 26b and the slide portion 26c which are shown in a front elevational view of FIG. 4A, and is configured to be pressed from both sides so as to contact closely to the back surface of the top plate 22.

Figure 5A:
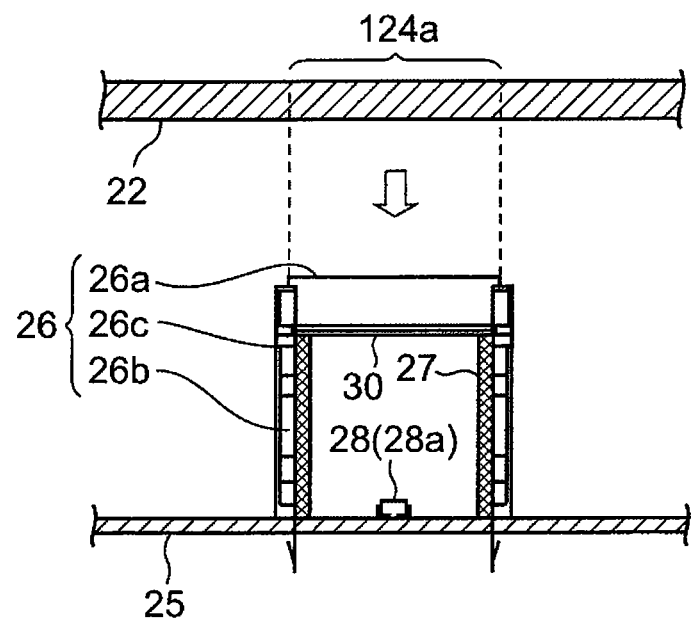
FIG. 5A is a side elevational cross sectional view showing the state before the operation portion is assembled in the heating cooker of the embodiment 1 according to the present invention.
Figure 5B:
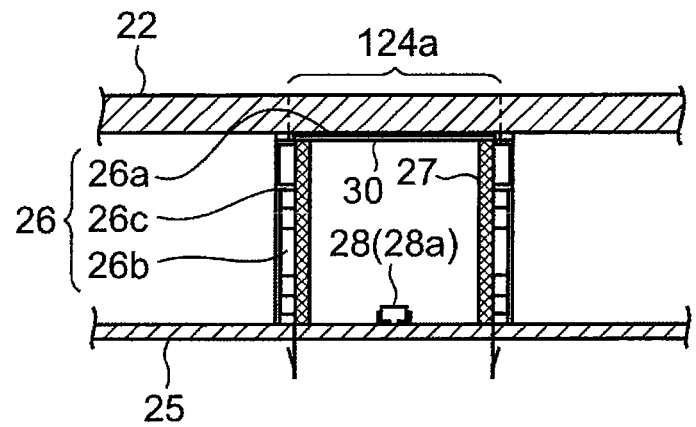
FIG. 5B is a side elevational cross sectional view showing the state after the operation portion is assembled in the heating cooker of the embodiment 1 according to the present invention.

FIG. 5A is a side elevational cross sectional view showing the operation switch electrode portion 24a which is provided just below the operation switch region 124a on the top plate 22 in the heating cooker of the embodiment 1, and shows a state before the top plate 22 is mounted on the main body 21. FIG. 5B is a side elevational cross sectional view showing a state where the top plate 22 is mounted on the operation switch electrode portion 24a shown in FIG. 5A, and the top plate 22 is fixed to the main body 21. As shown in FIG. 5A, the detection portion 26a is in a state of being supported on both a front surface and a back surface by the spring portion 26b and the slide portion 26c, and somewhat protruded toward the back surface of the top plate 22. Further, as shown in FIG. 5B, when the top plate 22 is mounted on the operation switch electrode portion 24a and the top plate 22 is fixed to the main body 21, a whole surface of the detection portion 26a having a flat detection surface contacts closely to the back surface of the top plate 22. Three through holes which are open upward and downward are formed in the guide holder 27 of the operation portion 24. In this case, in the embodiment 1, a hole of the guide holder 27 is provided as a rectangular hole, however, the present invention does not specify a shape of the hole. The detection portion 26a which is provided so as to cover an upper opening of each of the holes of the guide holder 27 is configured to be pressed against the back surface of the top plate 22 by the spring portion 26b and the slide portion 26c which are provided in both side surfaces of the guide holder 27.

The operation portion 24 having the operation switch electrode portion 24a and the calorie operation switch electrode portion 24b which are configured as mentioned above is mounted on an operation substrate 25 which is fixed to the main body 21, and is arranged at a predetermined position within the main body 21.

In the heating cooker of the embodiment 1, an LED 28 serving as a light emitting means is provided in the operation substrate 25 on which the operation portion 24 is mounted (refer to FIG. 5A and FIG. 5B). The LED 28 serving as the light emitting means which is mounted on the operation substrate 25 is arranged in each of the holes of the guide holder 27 of the operation portion 24 which is mounted on the operation substrate 25.

Figure 6:
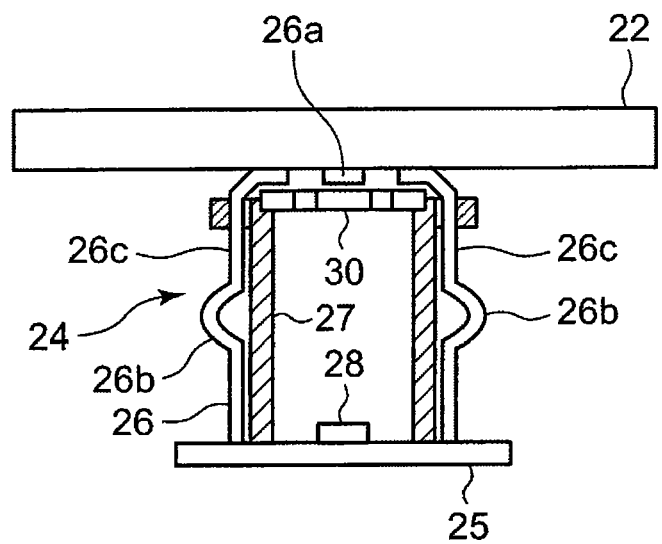
FIG. 6 is a cross sectional view showing in a simplified manner a configuration of the operation portion in the heating cooker of the embodiment 1 according to the present invention.

FIG. 6 is a cross sectional view showing in a simplified manner the configuration of the operation portion 24 in the heating cooker of the embodiment 1. As shown in FIG. 6, in the electrode portion (for example, the operation switch electrode portion 24a) which is provided just below the top plate 22, the detection portion 26a of the electrode terminal portion 26 is supported so as to be slidable in an upward and downward direction in both sides thereof by the slide portion 26c, and is configured to be pressed against the back surface of the top plate 22 (the operation switch region 124) by the spring portion 26b. Further, a name plate 30 mentioned below is provided at a position of the top surface of the guide holder 27. The LED 28 serving as the light emitting element is provided in the operation substrate 25 on which the guide holder 27 is mounted, and is configured such that the LED 28 is arranged in the guide holder 27 and irradiates the back surface of the name plate 30.

In the vicinity of the operation portion 24 having the electrode portions (the operation switch electrode portion 24a and the calorie operation switch electrode portion 24b) which are configured as mentioned above, there is provided an operation display portion 29 such as an indicator display indicating a heating condition of the cooking container as the object to be heated, for example, a heating calorie. The user of the heating cooker checks the indicator display or the like of the operation display portion 29, and operates the electrostatic touch switch or the like of the operation switch electrode portion 24a and/or the calorie operation switch electrode portion 24b located at a position corresponding to the operation switch region 124 on the top plate 22.

In the heating cooker of the embodiment 1, one name plate 30 indicating the operation content of the electrostatic touch switch is attached to the top surface opening of the guide holder 27 having three holes which are open upward and downward. Light transmission portions 30a, 30b and 30c (refer to FIG. 7A) through which the light transmits are formed in the name plate 30, and an individual simple character indicating the operation content of each of the electrostatic touch switches is formed by the light transmission portions 30a, 30b and 30c.

Figure 7A:
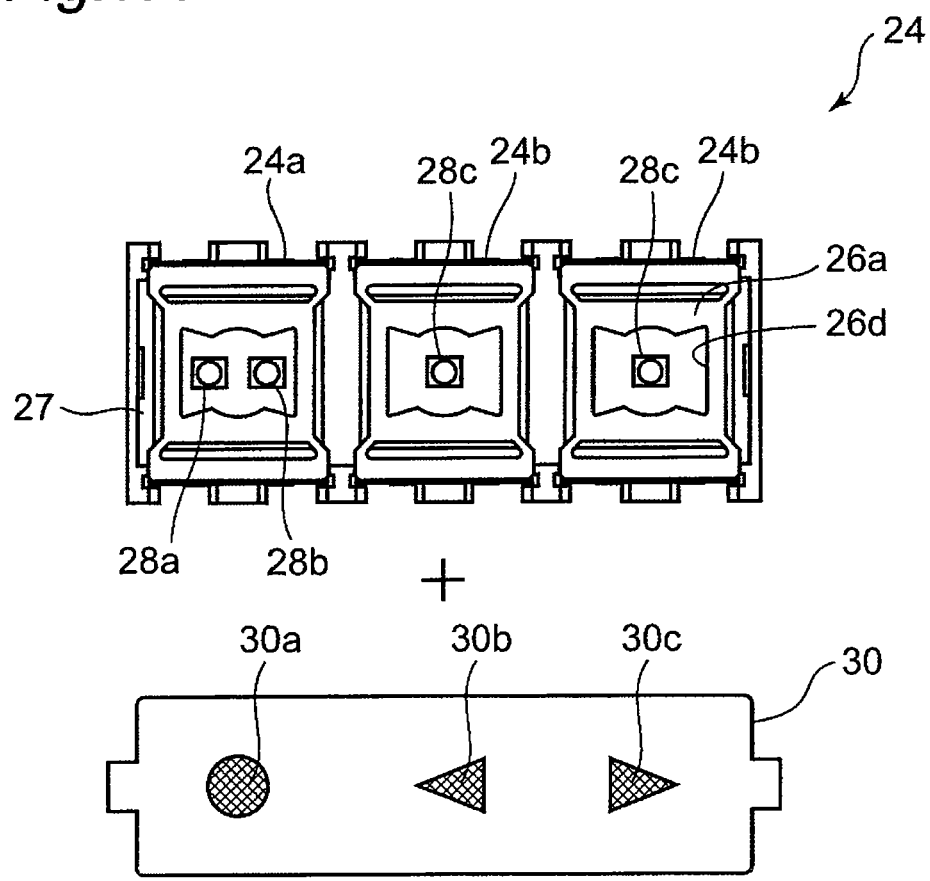
FIG. 7A is a plan view showing a configuration of parts of the operation portion in the heating cooker of the embodiment 1 according to the present invention.
Figure 7B:
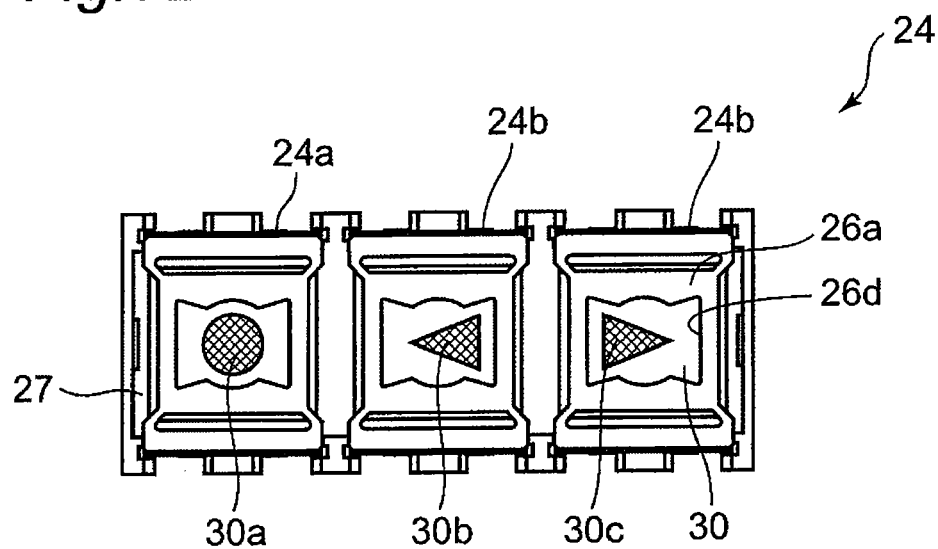
FIG. 7B is a plan view showing a state where a name plate is attached to the operation portion shown in FIG. 7A.

FIG. 7A is a plan view showing a configuration of parts of the operation portion 24 in the heating cooker of the embodiment 1. In the operation portion 24 shown in the plan view of FIG. 7A, a state where the name plate 30 is detached is shown. FIG. 7B is a plan view showing a state where the name plate 30 is attached to the operation portion 24 shown in FIG. 7A.

As shown in FIG. 7A, in the heating cooker of the embodiment 1, one operation switch electrode portion 24a and two calorie operation switch electrode portions 24b and 24b are provided side by side so as to be unitized. One name plate 30 is arranged in a lower side of three detection portions 26a, and is configured such that a simple character displayed on the name plate 30 appears from an opening 26d which is formed in the detection portion 26a. Accordingly, the opening 26d of the detection portion 26a has a complex shape putting together various character shapes, so that the various characters shown by the light transmission portion 30a of the name plate 30 can appear.

Further, as shown in FIG. 7A, a white light emitting LED 28a and a red light emitting LED 28b are provided side by side so as to be mounted in the hole of the guide holder 27 of the operation switch electrode portion 24a. An orange light emitting LED 28c is mounted in the hole of the guide holder 27 of the calorie operation switch electrode portion 24b.

A description will be given in further detail of the simple character shape which is displayed on the name plate 30 in the heating cooker of the embodiment 1.

In the heating cooker of the embodiment 1, a circular character shape corresponding to the operation content of the electrostatic touch switch is formed by the light transmission portion 30a in the name plate 30 of the operation switch electrode portion 24a. It is configured such that when a heating operation is in an off state, the circular light transmission portion 30a of the name plate 30 which is irradiated by the white light emitting LED 28a emits white light, and the off state of the heating operation is checked through the top plate 22. Further, it is configured such that when the heating operation is in an on state, the circular light transmission portion 30a of the name plate which is irradiated by the red light emitting LED 28b emits red light.

In two calorie operation switch electrode portions 24b and 24b, a rightward looking triangular character shape is formed by the light transmission portion 30c in correspondence to a calorie operation for raising a heating calorie, in the name plate 30 which exists in the calorie operation switch electrode portion 24b arranged in a right side. In the name plate 30 which exists in the calorie operation switch electrode portion 24b arranged in a left side, a leftward looking triangular character shape is formed by the light transmission portion 30b in correspondence to a calorie operation for reducing the heating calorie.

As mentioned above, the circular character shape (30a), the rightward looking triangular character shape (30c) and the leftward looking triangular character shape (30b) are formed in the name plate 30. On the other hand, the opening 26d of each of the detection portions 26a of the operation switch electrode portion 24a and the calorie operation switch electrode portion 24b has the same shape, that is, a complex shape putting together the circular character shape, the rightward looking triangular character shape and the leftward looking triangular character shape of the name plate 30. Accordingly, each of the detection portions 26a of the operation switch electrode portion 24a and the calorie operation switch electrode portion 24b is configured such that each of the character shapes on the name plate 30 can securely appear.

In this case, in the embodiment 1, a description will be given of an example in which plural kinds of character shaped light transmission portions (30a, 30b, 30c) are formed in one name plate 30, however, it can be configured such that one character shaped light transmission portion is formed in one name plate 30, and each of the name plates is installed to a top surface opening of each of the holes in the guide holder.

In the heating cooker of the embodiment 1, since the operation switch electrode portion 24a and the calorie operation switch electrode portion 24b are configured as mentioned above, each of the characters can be securely displayed in the operation switch region 124a and the calorie operation switch region 124b on the top plate 22.

Further, in the heating cooker of the embodiment 1, the respective control portions 31 are provided below the first heating unit 23a and the second heating unit 23b. If the operation portion 24 is operated by the touch of the finger or the like of the user in the operation switch region 124a and/or the calorie operation switch region 124b on the top plate 22, the electrostatic capacity of the operation switch electrode portion 24a and/or the calorie operation switch electrode portion 24b changes, and an operation signal is formed in a signal processing portion which is configured by a comparator or the like, in correspondence to the change of the electrostatic capacity. The formed operation signal is input to the control portion 31, and the control portion 31 carries out a control of the heating cooker in accordance with a predetermined sequence.

[Operation of Heating Cooker]

A description will be given below of an operation of the heating cooker of the embodiment 1 which is configured as mentioned above.

First of all, the cooking container as the object to be heated is placed on the top plate 22 just above a position where the first heating unit 23a and/or the second heating unit 23b is provided. If a power supply (not shown) of the heating cooker is applied, the LED 28a of the operation switch electrode portion 24a just below the operation switch region 124a on the top plate 22 is excited so as to emit white light. By the white light emission of the LED 28a, the light transmission portion 30a of the name plate 30 of the operation switch electrode portion 24a is irradiated, and a white circle is displayed in the operation switch region 124a on the top plate 22. If the user touches the operation switch region 124a in a state where the white circle is displayed in the operation switch region 124a, the electrostatic capacity of the operation switch electrode 24a changes, the operation signal is input to the control portion 31, the LED 28b is excited so as to emit red light, and the white light emitting LED 28a is turned off. As mentioned above, since the LED 28b is exited so as to emit red light, the light transmission portion 30a of the name plate 30 of the operation switch electrode portion 24a is irradiated, and the red circle which is emitted in the operation switch region 124a on the top plate 22 is displayed. Since the red circle which is emitted in the operation switch region 124a is displayed, the heating cooker is indicated its heating state, the heating cooker is excited under a predetermined condition, and the heating operation of the cooking container is started.

Further, at the same time when the red circle emitted in the operation switch region 124a is displayed, the LED 28c of the calorie operation switch electrode portion 24b existing just below the calorie operation switch region 124b is excited so as to emit orange light. Since the LED 28c is excited so as to emit orange light as mentioned above, the light transmission portions 30b and 30c of the name plate 30 of the calorie operation switch electrode portion 24b are irradiated, and a place of the calorie operation switch region 124b on the top plate 22 is indicated. In the case that the user changes the heating condition, that is, the heating calorie of the cooking container, the heating calorie is regulated by touching the calorie operation switch region 124b while checking the heating calorie of the operation display portion 29. For example, the heating calorie is regulated to a desired amount by touching the rightward looking triangular character in the calorie operation switch region 124b so as to change the electrostatic capacity of the calorie operation switch electrode portion 24b existing just therebelow in the case of enlarging the heating calorie, and touching the leftward looking triangular character in the calorie operation switch region 124b so as to change the electrostatic capacity of the calorie operation switch electrode portion 24b existing just therebelow, in the case of making the heating calorie small inversely.

The electrostatic capacity of the operation switch electrode portion 24a changes by retouching the operation switch region 124a on the top plate 22 at a time when the heating cooking is finished with respect to the cooking container, whereby the heating operation is stopped. At this time, at the same time of indicating that the heating is under stop, by exciting the LED 28a of the operation switch electrode portion 24a so as to emit white light, the current-carrying with respect to the LED 28b and the LED 28c of the calorie operation switch electrode portion 24b is stopped.

[Effect in Heating Cooker of Embodiment 1]

A description will be given below of an effect in the heating cooker of the embodiment 1 which is configured as mentioned above.

In the heating cooker of the embodiment 1, in each of the electrode portions 24a and 24b of the operation portion 24, the guide holder 27 movably retains the slide portion 26c of the electrode terminal portion 26, and the detection portion 26a of the electrode terminal portion 26 expands and contracts in the upward and downward direction by the spring portion 26b, and stably and securely contacts closely to the back surface of the operation switch region 124 on the top plate 22. Accordingly, in the heating cooker of the embodiment 1, when the top plate 22 is mounted on the main body 21 upon assembling and maintenance, the detection portion 26a of the electrode terminal portion 26 securely contacts closely to the back surface of the top plate 22, a distance to the operation switch region 124 on the top plate 22 becomes constant, and there is no fear that the distance varies.

In the heating cooker of the embodiment 1, the operation portion 24 is provided as the electrostatic capacity type touch switch, and the user touches the operation switch region 124 on the top plate 22, whereby the electrostatic capacity of the detection portion 26a of the electrode terminal portion 26 changes, and the operation signal is formed. The control portion 31 controls the corresponding heating unit or the like in accordance with the predetermined sequence based on the formed operation signal.

In the heating cooker of the embodiment 1, since the user can operate in the operation switch region 124 on the top plate 22, a handling becomes easy, and a heating cooker having an excellent operability is achieved. Further, since the operation switch region 124 is flat without having any projection and dent, it is easy to clean up, and it is user friendly. Further, since the operation switch region 124 is formed in the flat top plate 22, a design becomes simple, and it is possible to configure a heating cooker having an excellent design property.

In the heating cooker of the embodiment 1, since it is configured such that a whole surface of the detection surface of the detection portion 26a of the electrode terminal portion 26 stably and securely contacts closely to the back surface of the operation switch region 124 on the top plate 22, there is no dispersion upon assembling and maintenance, and a stable operating feeling can be obtained. Further, since the detection portion 26a is integrally formed in the electrode terminal portion 26, there is no dispersion of a contact resistance in the electrode terminal portion 26, and a stable operating feeling can be obtained with age.

In the heating cooker of the embodiment 1, it is configured such that the spring portion 26b and the slide portion 26c which expand and contract in the upward and downward direction are arranged respectively in both side surfaces so as to pinch the detection portion 26a which is formed in the top surface of the electrode terminal portion 26, and the electrode terminal portion 26 is guided and retained by the guide holder 27. Accordingly, the detection portion 26a is pressed against the back surface of the operation switch region 124 on the top plate 22 from both sides thereof so as to form an inboard support (both side support), and is configured to more stably and securely contact closely to the back surface of the operation switch region 124.

If the detection portion of the electrode terminal portion is a cantilever support (one side support), the detection surface of the detection portion is inclined at a time when the electrode terminal portion somewhat deforms upon assembling and maintenance, and comes into biased contact with the back surface of the top plate 22, and there is a risk that only a part of the detection portion comes into contact with the back surface of the top plate 22. However, in the heating cooker of the embodiment 1, the detection portion 26a is inboard supported (supported on both sides) by the slide portion 26c and the spring portion 26b, and has such a stroke that both sides of the detection portion 26a expand and contract similarly in the upward and downward direction by the spring portion 26b. Accordingly, it is not necessary to arrange a height position of the electrode terminal portion 26 at a high precision, and it is possible to arrange the electrode terminal portion 26 within the main body 21 on the safe side. According to the configuration of the heating cooker of the embodiment 1, there is no fear that the detection surface of the detection portion 26a comes into biased contact with the back surface of the operation switch region 124, the detection surface of the detection portion 26a and the back surface of the operation switch region 124 securely stick fast as a whole, and it is possible to widely reduce a generation of a defective unit.

In the heating cooker of the embodiment 1, the light emitting element (LED) is arranged on the operation substrate 25 in the hole of the guide holder 27, and the light of the light emitting element irradiates the back surface of the operation switch region 124 on the top plate 22 through the light transmission portion (30a, 30b, 30c) of the name plate 30 and the detection portion 26a of the electrode terminal portion 26. Accordingly, the operation switch region 124 becomes definite, and it is possible to prevent the pan or the like from being placed on the operation switch region 124 on the top plate 22 during the heating operation, which will otherwise reach a high temperature. Further, since the operation switch region 124 has the configuration in which the light transmits, the user can easily identify the operation switch region 124, and an improvement of an operability can be achieved.

As mentioned above, the heating cooker of the embodiment 1 is configured such that the light from the light emitting element irradiates the back surface of the operation switch region 124 on the top plate 22 through the light transmission portion (30a, 30b, 30c) of the name plate 30. Accordingly, it is configured such that an individual simple character shape indicating the operation content securely appears in the operation switch region 124. Since the name plate 30 having the light transmission portion indicating the operation content is provided in the electrode terminal portion 26 as mentioned above, the user can easily identify the operation content, and it is possible to further improve an operability.

Further, in the heating cooker of the embodiment 1, the name plate 30 having the individual simple character shaped light transmission portion (30a, 30b, 30c) indicating the operation content of the electrostatic touch switch is attached to the top surface of the guide holder 27. Further, the name plate 30 is arranged within the electrode terminal portion 26, and it is configured such that the character shape of the light transmission portion of the name plate 30 appears from the opening 26d of the detection portion 26a of the electrode terminal portion 26. The name plate 30 is arranged so as to have a gap with respect to the back surface of the top plate 22, and the operation substrate 25 is arranged in a lower side of the name plate 30. Accordingly, a heat transfer from the top plate 22 which reaches a high temperature by placing the cooking container as the object to be heated thereon is prevented by the name plate 30, and it is possible to reduce an influence of the heat from the heated object with respect to the operation substrate 25.

In the heating cooker of the embodiment 1, since the opening 26d in a complex shape putting together a plurality of simple character shapes indicating the operation content is formed in the detection portion 26a which is formed in the top surface of the electrode terminal portion 26, a shape of the opening 26d of the detection portion 26a through which the light from the light emitting element passes is set as small as possible. As a result, it is possible to make an area of the detection surface of the detection portion 26a relatively large. Therefore, the detection portion 26a can largely receive the change of the electrostatic capacity which serves as the touch switch, and an operability thereof is improved.

In the detection portion, in order to largely receive the change of the electrostatic capacity, a predetermined area or more is necessary as the detection surface of the detection portion. However, since the detection surface is reduced by forming the opening in the detection portion, it becomes hard to detect the change of the electrostatic capacity.

Accordingly, a smaller opening of the detection portion is preferable, however, if the opening is made smaller, the character shape to be formed in the name plate becomes smaller, and a visibility is deteriorated. On the other hand, if the detection surface of the detection portion is formed large without making the opening small, the operation portion becomes large, and it becomes hard to provide a plurality of operation portions.

Accordingly, in the heating cooker of the embodiment 1, the shape of the opening 26d of the detection portion 26a is formed as small as possible so that the light of the light emitting element passes through the character shaped light transmission portion (30a, 30b, 30c) of the name plate 30 and passes through the detection portion 26a, by forming the opening 26d in a complex shape putting together a plurality of simple character shapes indicating the operation content in the detection portion 26a. Accordingly, since the heating cooker of the embodiment 1 is configured such that it can largely receive the change of the electrostatic capacity, it becomes easy to form the detection surface having a predetermined area or more in the detection portion 26a. As a result, in the configuration of the heating cooker of the embodiment 1, it is not necessary to form the operation portion 24 large in order to achieve an improvement of the operability, and it is possible to design the operation portion 24 compact.

Further, in the heating cooker of the embodiment 1, since it is configured to display the operation content by changing the color generation of the light emitting element in correspondence to the state of the heating cooker, it is possible to improve an optical visibility with respect to the user and a further improvement is intended in a usability.

Embodiment 2

Figure 8:
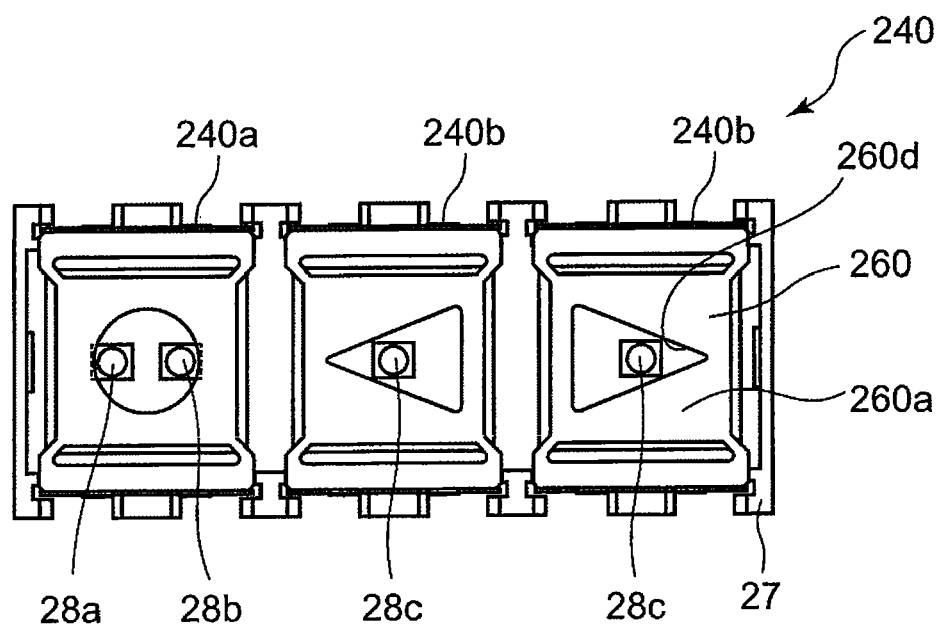
FIG. 8 is a plan view showing a configuration of an operation portion in a heating cooker of an embodiment 2 according to the present invention.

A description will be given below of a heating cooker of an embodiment 2 according to the present invention with reference to FIG. 8. FIG. 8 is a plan view showing a configuration of an operation portion 240 which serves as an operation device in the heating cooker of the embodiment 2 according to the present invention. In the heating cooker of the embodiment 2, a different point from the heating cooker of the embodiment 1 mentioned above is a configuration of the operation portion 240, and the other configurations are the same as the heating cooker of the embodiment 1. In the heating cooker of the embodiment 2, a detection portion 260a of an electrode terminal portion 260 has a character shaped opening 260d. In the description of the embodiment 2, the same reference numerals are attached to the elements having the same functions and configurations as the heating cooker of the embodiment 1 mentioned above and a description thereof will be omitted.

The electrode terminal portion 260 in the heating cooker of the embodiment 2 is provided with a detection portion 260a which comes into close contact with the back surface of the top plate 22, a slide portion 260c which is integrally formed with the detection portion 260a and slidably engages with the guide holder 27, and a spring portion 260b which has an elastic force pressing the detection portion 260a so as to come into close contact with the back surface of the top plate 22, and is fixed in its one end to the guide holder 27, in the same manner as the electrode terminal portion 26 in the heating cooker of the embodiment 1 mentioned above. Accordingly, the detection portion 260a is pressed against the back surface of the top plate 22 from both sides due to the elastic force of the spring portion 260b which is supported on both sides of the detection portion 260a. In the embodiment 2, the spring portion 260b and the slide portion 260c in the electrode terminal portion 260 have the same configurations as the spring portion 26b and the slide portion 26c of the electrode terminal portion 26 in the embodiment 1, and have the same functions (refer to FIG. 4A and FIG. 4B).

As shown in FIG. 8, the simple character shaped opening 260d indicating the operation content of the electrostatic touch switch is formed in the detection portion 260a which is formed in the top surface of the electrode terminal portion 260.

A description will be given further in detail of the character shape which is formed in the detection portion 260a of the electrode terminal portion 260.

In the operation portion 240, the operation switch electrode portion 240a is an electrostatic capacity type touch switch for carrying out an on and off operation of the heating operation. The circular opening 260d is formed in a simple character shape indicating the operation content, in the detection portion 260a of the electrode terminal portion 260 in the operation switch electrode portion 240a. Further, in two calorie operation switch electrode portions 240b and 240b arranged side by side, the calorie operation switch electrode 240b in a right side of FIG. 8 is an electrostatic capacity type touch switch which is used for raising a heating calorie, and a rightward looking triangular opening 260d is formed in the detection portion 260a. On the other hand, the calorie operation switch electrode portion 240b in a left side of FIG. 8 is an electrostatic capacity type touch switch which is used for reducing the heating calorie, and a leftward looking triangular opening 260d is formed in the detection portion 260a.

Further, in the heating cooker of the embodiment 2, since it is configured such that the simple character shaped opening 260d indicating the operation content is formed in the detection portion 260a which is formed in the top surface of the electrode terminal portion 260, the name plate indicating the individual simple character shape indicating the operation content is not necessary. As a result, the heating cooker of the embodiment 2 is simple in its configuration in comparison with the heating cooker of the embodiment 1, and the configuration for preventing the displacement of the name plate with respect to the detection portion 260a of the electrode terminal portion 260 or the like is not necessary.

Further, in the heating cooker of the embodiment 2, since the detection portion 260a which is formed in the top surface of the electrode terminal portion 260 contacts closely to the back surface of the operation switch region 124 on the top plate 22, the light passing through the character shaped opening 260d which is formed in the detection portion 260a directly irradiates the back surface of the operation switch region 124. In other words, since the light passing through the character shaped opening 260d which is formed in the detection portion 260a is not affected by a shadow or the like of a peripheral structure, has no chip of the character shape which tends to be generated at a time when the user views from a diagonal direction, and the definite character shape is displayed in the operation switch region 124, a visibility is improved.

Embodiment 3

A description will be given below of a heating cooker of an embodiment 3 according to the present invention. In the heating cooker of the embodiment 3 according to the present invention, a different point from the heating cooker of the embodiment 1 mentioned above is a configuration of the operation portion which serves as the operation device. Therefore, in the heating cooker of the embodiment 3, a description will be particularly given of the operation portion, and the same reference numerals are attached to the other elements than the operation portion which have the same functions and configurations as the heating cooker of the embodiment 1, and a description thereof will employs the description of the embodiment 1 mentioned above.

As shown in the plan view of FIG. 1 mentioned above, the heating cooker of the embodiment 3 has the top plate 22 which serves as the top surface of the main body 21, and an operation switch region 124 and an operation display region 129 are formed within the user side region, on the top plate 22. In this case, the display mark of the operation switch region 124 on the top plate in the heating cooker of the embodiment 3 is different as mentioned below.

In the heating cooker of the embodiment 3, the outputs of the first heating unit 23a and the second heating unit 23b which are arranged just below the top plate 22 are controlled by the contact of the finger or the like of the user with the operation switch region 124a and/or the calorie operation switch region 124b of the operation switch region 124 on the top plate 22. Just below the operation switch region 124a, there is provided an electrostatic touch switch for carrying out an on and off control of the heating operation of the heating cooker. Further, just below the calorie operation switch region 124b, there is provided an electrostatic touch switch for regulating the calorie of the heating cooker.

Further, the operation display region 129 on the top plate 22 is provided with a plurality of display marks so as to indicate the heating calorie, and is configured such that the heating calorie can be regulated visually by the lighting number of the display mark. Accordingly, the lighting state of the display mark of the operation display region 129 changes by the user coming into contact with the calorie operation switch region 124b indicating the right and left directions, whereby the heating calorie is indicated.

Figure 9:
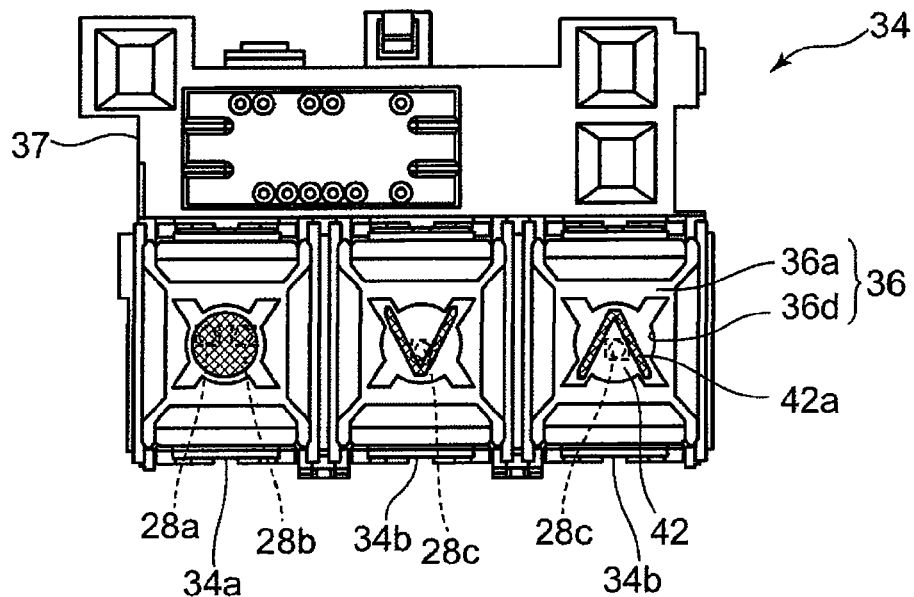
FIG. 9 is a plan view showing a configuration of an operation portion in a heating cooker of an embodiment 3 according to the present invention.
Figure 10:
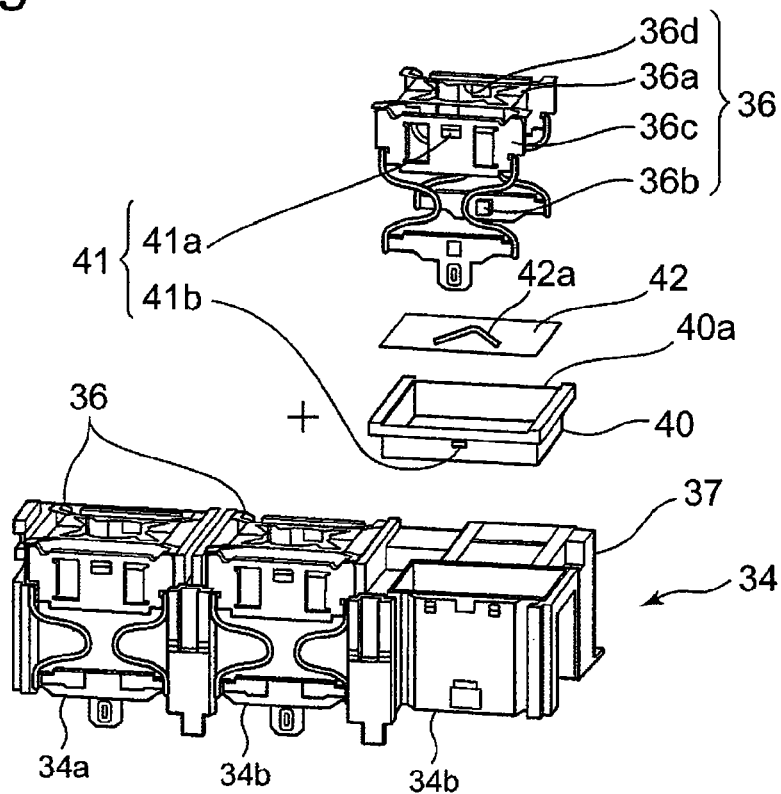
FIG. 10 is a perspective view showing in an exploded manner a part of the operation portion in the heating cooker of the embodiment 3 according to the present invention.

FIG. 9 is a plan view showing a configuration of an operation portion 34 in the heating cooker of the embodiment 3 according to the present invention. FIG. 10 is a perspective view showing in an exploded manner a part of the operation portion 34 in the heating cooker of the embodiment 3.

The operation portion 34 in the heating cooker of the embodiment 3 is configured to have three electrode terminal portions 36 for carrying out three kinds of operations, a name plate 42 which has three kinds of character shaped light transmission portions 42a, a guide holder 37 which slidably retains three electrode terminal portions 36, and a light shielding portion 40 which is integrally movable with each of the electrode terminal portions 36, and is arranged between a detection portion 36a of each of the electrode terminal portions 36 and the guide holder.

The electrode terminal portion 36 in the embodiment 3 is integrally made of a metal material in the same manner as the electrode terminal portion 26 in the heating cooker of the embodiment 1 mentioned above. The electrode terminal portion 36 is provided with the detection portion 36a which comes into close contact with the back surface of the top plate 22, a slide portion 36c which is integrally formed continuously with the detection portion 36a, and slidably engages with the guide holder 37, and a spring portion 36b which has an elastic force pressing the detection portion 36a so as to come into close contact with the back surface of the top plate 22 (the operation switch region 124), and is fixed in its one end to the guide holder 37. Accordingly, the detection portion 36a is securely pressed against the back surface of the top plate 22 due to the elastic force of the spring portion 36b which is supported through the slide portion 36c in both sides of the detection portion 36a. Further, since the slide portion 36c slides and is retained in both sides of the guide holder 37, the detection surface of the detection portion 36a is pressed in parallel against the back surface of the top plate 22, and securely sticks fast in a whole surface with no gap.

As shown in FIG. 9, an opening 36d in a complex shape putting together simple character shapes indicating the operation contents of the respective electrostatic touch switches is formed in the detection portion 36a which is formed in the top surface of the electrode terminal portion 36. Accordingly, a character shaped light transmission portion 42a indicating each of the operation contents securely appears in the opening 36d of the detection portion 36a. Specifically, in the opening 36d of the detection portion 36a, the circular light transmission portion 42a appears in the operation switch electrode portion 34a which exists in a left side of FIG. 9, and the downward looking and upward looking shaped light transmission portions 42a appears in the calorie operation switch electrode portions 34b which exist in the center and a right side.

As shown in a perspective view in FIG. 10, a rectangular frame-shaped light shielding portion 40 is provided in the operation portion 34 in the heating cooker of the embodiment 3. The name plate 42 is installed to an opening in a top surface of the light shielding portion 40, and the detection portion 36a is arranged on the name plate in a close contact manner. Further, the light shielding portion 40 engages with the electrode terminal portion 36, and is connected so as to move similarly in correspondence to a movement in an upward and downward direction of the electrode terminal portion 36. The light shielding portion 40 is arranged so as to be movable along an inner wall surface of the guide holder 37, and has such a function as to occlude the gap between the detection portion 36a of the electrode terminal portion 36 and the guide holder 37.

Figure 11A:
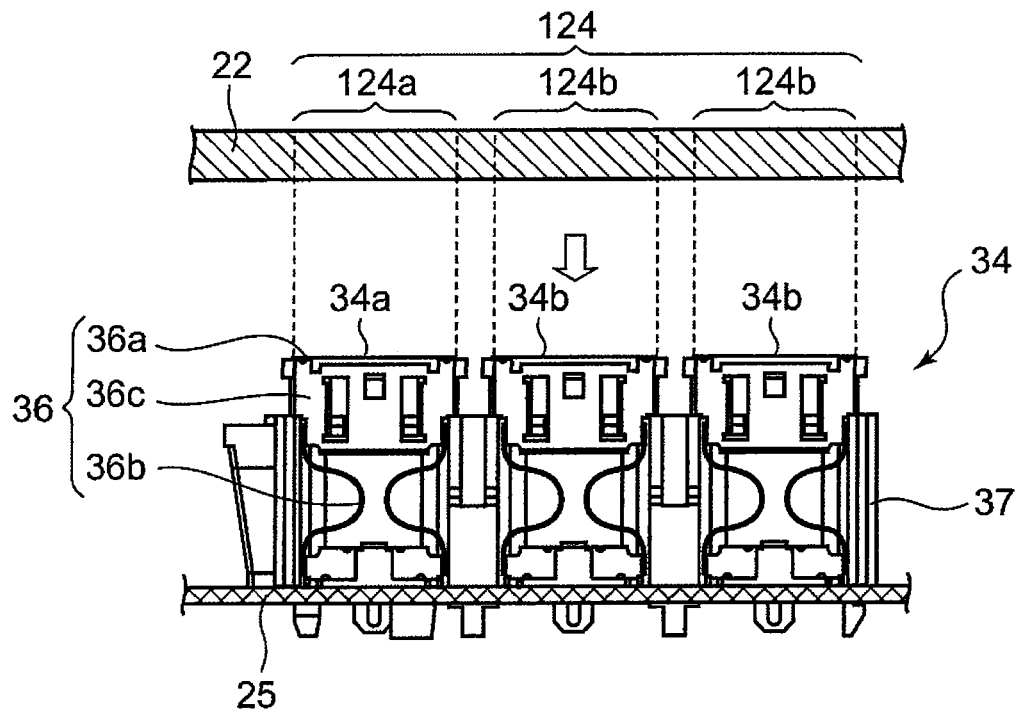
FIG. 11A is a front elevational view showing a state before the operation portion is assembled in the heating cooker of the embodiment 3 according to the present invention.
Figure 11B:
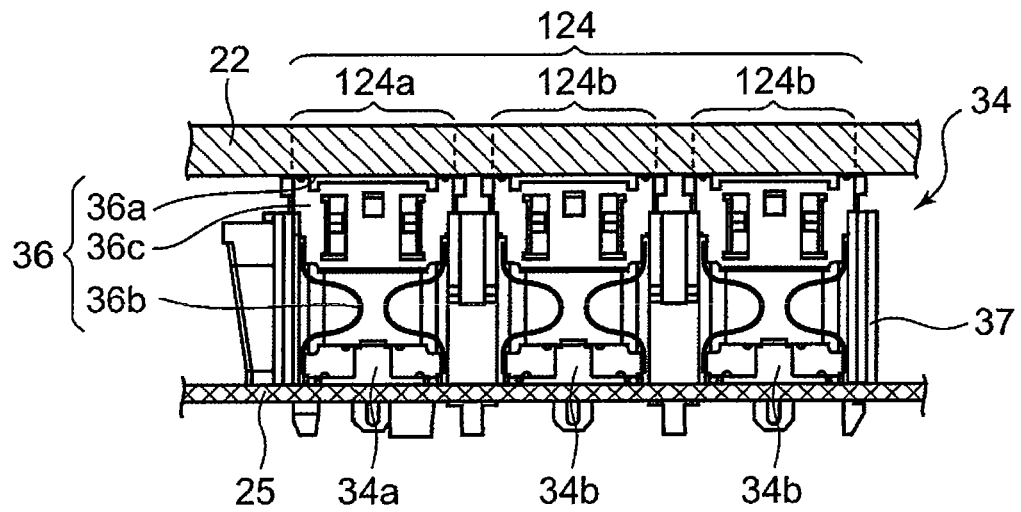
FIG. 11B is a front elevational view showing a state after the operation portion is assembled in the heating cooker of the embodiment 3 according to the present invention.
Figure 12A:
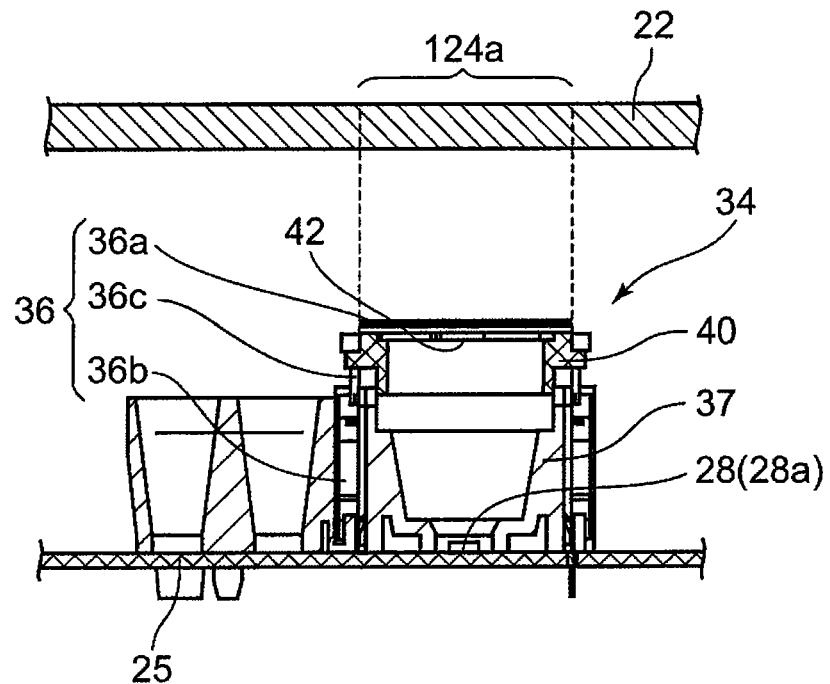
FIG. 12A is a side elevational cross sectional view showing the state before the operation portion is assembled in the heating cooker of the embodiment 3 according to the present invention.
Figure 12B:
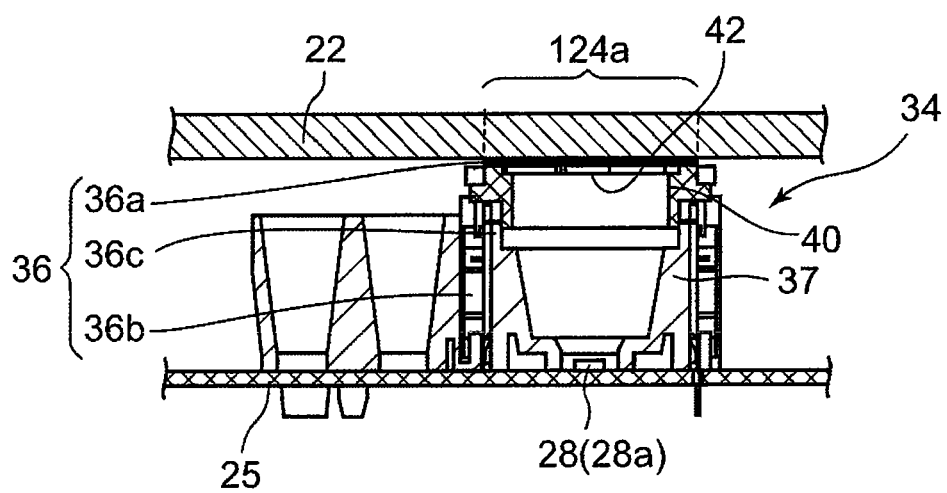
FIG. 12B is a side elevational cross sectional view showing the state after the operation portion is assembled in the heating cooker of the embodiment 3 according to the present invention.

FIG. 11A is a front elevational view showing the operation portion 34 which is provided just below the operation switch region 124 on the top plate 22 in the heating cooker of the embodiment 3, and has one operation switch electrode portion 34a and two calorie operation switch electrode portions 34b and 34b. In FIG. 11A, there is shown a state before the top plate 22 is mounted on the main body 21. FIG. 11B is a front elevational view showing a state where the top plate 22 is mounted on the operation portion 34 shown in FIG. 11A, and the top plate 22 is fixed to the main body 21. Further, FIG. 12A is a side elevational cross sectional view showing the operation portion 34 which is provided just below the operation switch region 124 on the top plate 22 in the heating cooker of the embodiment 3. In FIG. 12A, there is shown a state before the top plate 22 is mounted on the main body 21. FIG. 12B is a side elevational cross sectional view showing a state where the top plate 22 is mounted on the operation portion 34 shown in FIG. 12A, and the top plate 22 is fixed to the main body 21. In this case, in the operation portion 34, the operation switch electrode portion 34a and the calorie operation switch electrode portion 34b have the same configuration.

As shown in FIG. 11A and FIG. 12A, the detection portion 36a is supported (inboard supported) on both of a front surface and a back surface by the spring portion 36b and the slide portion 36c, and is somewhat protruded toward the back surface of the top plate 22. Further, as shown in FIG. 11B and FIG. 12B, when the top plate 22 is mounted on the operation portion 34, and the top plate 22 is fixed to the main body 21, a whole surface of the detection surface of the detection portion 36a is pushed down so as to contact closely to the back surface of the top plate 22 (the operation switch region 124). Three through holes which are open upward and downward are formed in the guide holder 37 of the operation portion 34. It is configured such that the detection portion 36a which is provided so as to cover an upper opening in each of the holes of the guide holder 37 is pressed against the back surface of the top plate 22 by the spring portion 36b and the slide portion 36c which are provided in both side surfaces of the guide holder 37.

The operation portion 34 having the operation switch electrode portion 34a and the calorie operation switch electrode portion 34b which are configured as mentioned above is mounted on the operation substrate 25 which is fixed to the main body 21, and is arranged at a predetermined position within the main body 21.

In the heating cooker of the embodiment 3, the LED 28 (28a, 28b, 28c) serving as the light emitting means are provided in the operation substrate 25 on which the operation portion 34 is mounted (refer to FIG. 9). The LED 28 which is mounted on the operation substrate 25 and serves as the light emitting means is arranged in each of the holes of the guide holder 37 of the operation portion 34 which is mounted on the operation substrate 25.

The white light emitting LED 28a and the red light emitting LED 28b are provided side by side so as to be mounted in the hole of the guide holder 37 of the operation switch electrode portion 34a. The orange light emitting LED 28c is mounted in the hole of the guide holder 37 of the calorie operation switch electrode portion 34b.

In the vicinity of the operation portion 34 which is configured as mentioned above, there is provided the operation display portion 29 such as the indicator display indicating the heating condition of the heating cooker container as the object to be heated, for example, the heating calorie. The user of the heating cooker checks the indicator display or the like of the operation display portion 29, and operates the operation switch electrode portion 34a, the calorie operation switch electrode portion 34b, and the like located at the positions corresponding to the operation switch region 124 on the top plate 22.

In the heating cooker of the embodiment 3, the electrode terminal portion 36 is provided with the frame-shaped light shielding portion 40 which can move upward and downward in the opening portion of the top surface of the guide holder 37. The light shielding portion 40 is provided so as to prevent the light of the LED 28 which is emitted in the hole of the guide holder 37 from leaking from the gap between the guide holder 37 and the electrode terminal portion 36. Engagement portions 41 engaging with each other are provided in the light shielding portion 40 and the electrode terminal portion 36. The engagement portion 41 in the heating cooker of the embodiment 3 is configured by a concave portion 41a (for example, a hole) which is formed in the slide portion 36c of the electrode terminal portion 36, and a convex portion 41b (for example, a projection) which is formed in the light shielding portion 40, and is configured such that the concave portion 41a and the convex portion 41b are engaged and connected. In the embodiment 3, the description is given of the example in which the engagement portion 41 is configured by the concave portion 41a and the convex portion 41b, however, the present invention is not limited to this configuration, but a connecting means by which the light shielding portion 40 and the electrode terminal portion 36 are connected to each other and integrally move is included in the present invention.

In the engagement portion 41 in the embodiment 3, the concave portion 41a as a hole is formed in a side surface which is derived from both sides of the detection portion 36a of the electrode terminal portion 36, and the convex portion 41b as a projection is formed in the corresponding side surface of the light shielding portion 40. The light shielding portion 40 is pinched and supported by the slide portions 36c in both side surfaces of the electrode terminal portion 36 by inserting the convex portion 41b of the light shielding portion 40 to the concave portion 41a of both the side surfaces (the slide portions 36c) of the electrode terminal portion 36. Accordingly, since the light shielding portion 40 is arranged between the detection portion 36a existing in the top surface of the electrode terminal portion 36 and the upper end of the guide holder 37, the light from the LED 28 in each of the holes of the guide holder 31 does not leak from the gap between the guide holder 37 and the detection portion 36a of the electrode terminal portion 36.

In the operation portion 34 in the embodiment 3, the name plate 42 having the individual simple character shaped light transmission portion 42a indicating the operation content of the electrostatic touch switch is attached to the opening portion 40a in the top surface of the light shielding portion 40. The opening 36d in a complex shape putting together a plurality of simple character shapes indicating the operation contents is formed in the detection portion 36a which is formed in the top surface of the electrode terminal portion 36. Accordingly, the character shaped light transmission portion 42a of the name plate 42 can securely appear in the opening 36d of the detection portion 36a of the electrode terminal portion 36.

Figure 13:
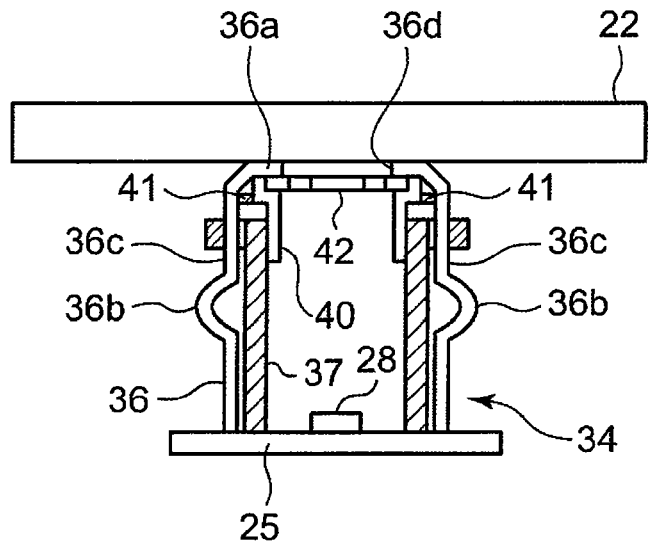
FIG. 13 is a cross sectional view showing in a simplified manner a configuration of the operation portion in the heating cooker of the embodiment 3 according to the present invention.

FIG. 13 is a cross sectional view showing in a simplified manner the configuration of the operation portion 34 in the heating cooker of the embodiment 3. As shown in FIG. 13, in the electrode portion (for example, the operation switch electrode portion 34a) which is provided just below the top plate 22, the detection portion 36a of the electrode terminal portion 36 is supported so as to be slidable in an upward and downward direction in both sides thereof by the slide portion 36c, and is configured to be pressed against the back surface of the top plate 22 by the spring portion 36b. Further, the light shielding portion 40 is provided at a position on the top plate of the guide holder 37 so as to be movable in the upward and downward direction. The name plate 42 is provided at a position of the top surface of the light shielding portion 40. The light shielding portion 40 and the slide portion 36c of the electrode terminal portion 36 are connected by the respectively formed engagement portions 41 (the concave portion 41a and the convex portion 41b) so as to integrally move with each other. Further, the LED 28 serving as the light emitting element is provided in the operation substrate 25 which is provided with the guide holder 37, and is configured such that the LED 28 is arranged in the guide holder 37 and irradiates the back surface of the name plate 42.

A description will be given in further detail of the simple character shape which is displayed on the name plate 42 in the heating cooker of the embodiment 3.

In the heating cooker of the embodiment 3, the circular character shaped light transmission portion 42a corresponding to the operation content of the electrostatic touch switch is formed in the name plate 42 of the operation switch electrode portion 34a. It is configured such that when a heating operation is in an off state, the circular light transmission portion 42a of the name plate 42 which is irradiated by the white light emitting LED 28a passes the white light, whereby the off state of the heating operation can be checked through the top plate 22. Further, it is configured such that when the heating operation is in an on state, the circular light transmission portion 42a of the name plate 42 which is irradiated by the red light emitting LED 28b passes the red light, whereby the on state of the heating operation can be checked through the top plate 22.

In two calorie operation switch electrode portions 34b and 34b, an inverted-V shaped character shaped light transmission portion 42a corresponding to a calorie operation for raising a heating calorie is formed in the name plate 42 of the calorie operation switch electrode portion 34b which is arranged in a right side. A V-shaped character shaped light transmission portion 42a corresponding to a calorie operation for reducing a heating calorie is formed in the name plate 42 of the calorie operation switch electrode portion 34b which is arranged in a left side.

As mentioned above, the light transmission portions 42a having the circular character shape, the inverted-V shaped character shape and the V-shaped character shape are formed in the name plate 42. On the other hand, the opening 36d of each of the detection portions 36a of the operation switch electrode portion 34a and the calorie operation switch electrode portion 34b has a complex shape putting together the circular character shape, the inverted-V shaped character shape and the V-shaped character shape of the name plate 42. Accordingly, the detection portion 36a of the electrode terminal portion 36 in each of the operation switch electrode portion 34a and the calorie operation switch electrode portion 34b is configured such that each of the character shapes corresponding to the operation contents can securely appear (refer to FIG. 9).

In the heating cooker of the embodiment 3, since the operation switch electrode portion 34a and the calorie operation switch electrode portion 34b are configured as mentioned above, each of the characters can be securely displayed in the operation switch region 124a and the calorie operation switch region 124b on the top plate 22.

Further, in the heating cooker of the embodiment 3, the respective control portions 31 are provided below the first heating unit 23a and the second heating unit 23b, the electrostatic capacity is changed in the operation switch electrode portion 34a and the calorie operation switch electrode portion 34b by the operation or the like on the operation switch region 124a and the calorie operation switch region 124b on the top plate 22, the operation signal is formed in the signal processing portion, and the heating cooker is controlled and driven in accordance with a predetermined sequence.

[Operation of Heating Cooker]

A description will be given below of an operation of the heating cooker of the embodiment 3 which is configured as mentioned above.

First of all, the cooking container as the object to be heated is placed on the top plate 22 just above a position where the first heating unit 23a and/or the second heating unit 23b is provided. If a power supply (not shown) of the heating cooker is applied, the LED 28a of the operation switch electrode portion 34a just below the operation switch region 124a on the top plate 22 is excited so as to emit white light. By the white light emission of the LED 28a, the name plate 42 of the operation switch electrode portion 34a is irradiated, and a white circle is displayed in the operation switch region 124a on the top plate 22. If the user touches the operation switch region 124a in a state where the white circle is displayed in the operation switch region 124a, the electrostatic capacity of the operation switch electrode 34a changes, the LED 28b is excited so as to emit red light, and the white light emitting LED 28a is turned off. As mentioned above, since the LED 28b is exited so as to emit red light, the name plate 42 of the operation switch electrode portion 34a is irradiated, and the red circle is displayed in the operation switch region 124a on the top plate 22. Since the red circle is displayed in the operation switch region 124a, the heating cooker is indicated its heating state, the heating cooker is excited under a predetermined condition, and the heating operation of the cooking container is started.

Further, at the same time when the red circle is displayed in the operation switch region 124a, the LED 28c of the calorie operation switch electrode portion 34b existing just below the calorie operation switch region 124b is excited so as to emit orange light. Since the LED 28c is excited so as to emit orange light as mentioned above, a place of the calorie operation switch region 124b on the top plate 22 is indicated. In the case that the user changes the heating condition, that is, the heating calorie of the cooking container, the heating calorie is regulated by touching the calorie operation switch region 124b while checking the heating calorie of the operation display portion 29. For example, the heating calorie is regulated to a desired amount by touching the inverted-V shaped character in the calorie operation switch region 124b so as to change the electrostatic capacity of the calorie operation switch electrode portion 34b existing just therebelow in the case of enlarging the heating calorie, and touching the V-shaped character in the calorie operation switch region 124b so as to change the electrostatic capacity of the calorie operation switch electrode portion 34b existing just therebelow, in the case of making the heating calorie small inversely.

The electrostatic capacity of the operation switch electrode portion 34a changes by retouching the operation switch region 124a on the top plate 22 at a time when the heating cooking is finished with respect to the cooking container, whereby the heating operation is stopped. At this time, at the same time of indicating that the heating is under stop, by exciting the LED 28a of the operation switch electrode portion 34a so as to emit white light, the current-carrying with respect to the red light emitting LED 28b and the LED 28c of the calorie operation switch electrode portion 34b is stopped.

[Effect in Heating Cooker of Embodiment 3]

A description will be given below of an effect in the heating cooker of the embodiment 3 which is configured as mentioned above.

In the heating cooker of the embodiment 3, in each of the electrode portions 34a and 34b of the operation portion 34, the guide holder 37 movably retains the slide portion 36c of the electrode terminal portion 36, and the detection portion 36a of the electrode terminal portion 36 expands and contracts in the upward and downward direction by the spring portion 36b, and is configured to stably and securely contact closely to the back surface of the operation switch region 124 on the top plate 22. Accordingly, in the heating cooker of the embodiment 3, when the top plate 22 is mounted on the main body 21 upon assembling and maintenance, the detection portion 36a of the electrode terminal portion 36 securely contacts closely to the back surface of the top plate 22, a distance to the operation switch region 124 on the top plate 22 becomes constant, and there is no fear that the distance varies.

In the heating cooker of the embodiment 3, the operation portion 24 is provided as the electrostatic capacity type touch switch, and the user touches the operation switch region 124 on the top plate 22, whereby the electrostatic capacity of the detection portion 36a of the electrode terminal portion 36 changes, and the operation signal is formed in the signal processing portion. The control portion 31 controls the corresponding heating unit or the like in accordance with the predetermined sequence based on the operation signal from the operation portion 34.

In the heating cooker of the embodiment 3, since the user can operate in the operation switch region 124 on the top plate 22, a handling becomes easy, and a heating cooker having an excellent operability is achieved. Further, since the operation switch region 124 is flat without having any projection and dent, it is easy to clean up, and it is user friendly. Further, since the operation switch region 124 is formed in the flat top plate 22, a design becomes simple, and it is possible to configure a heating cooker having an excellent design property.

In the heating cooker of the embodiment 3, since a whole surface of the detection portion 36a of the electrode terminal portion 36 stably and securely contacts closely to the back surface of the operation switch region 124 on the top plate 22, there is no dispersion upon assembling and maintenance, and a stable operating feeling can be obtained. Further, since the detection portion 36a is integrally formed in the electrode terminal portion 36, there is no dispersion of a contact resistance in the electrode terminal portion 36, and a stable operating feeling can be obtained with age.

In the heating cooker of the embodiment 3, it is configured such that the spring portion 36b and the slide portion 36c which expand and contract in the upward and downward direction are formed respectively in both side surfaces so as to pinch the detection portion 36a which is formed in the top surface of the electrode terminal portion 36, and the electrode terminal portion 36 is retained by the guide holder 37. Accordingly, since the detection portion 36a is configured as an inboard support so as to be pressed against the back surface of the operation switch region 124 on the top plate 22 from both sides thereof, the detection surface of the detection portion 36a stably and securely contacts closely to the back surface of the operation switch region 124.

If the detection portion of the electrode terminal portion is a cantilever support (one side support), the surface of the detection portion is inclined at a time when the electrode terminal portion somewhat deforms upon assembling and maintenance, and comes into biased contact with the back surface of the top plate 22, and there is a risk that only a part of the detection portion comes into contact with the back surface of the top plate 22. However, in the heating cooker of the embodiment 3, the detection portion 36a is inboard supported, and has such a stroke that the detection portion 36a expands and contracts in the upward and downward direction. Accordingly, it is not necessary to arrange the electrode terminal portion 36 at a high precision within the main body, there is no fear that the detection portion 36a comes into biased contact with the back surface of the operation switch region 124, the detection portion 36a and the back surface of the operation switch region 124 securely stick fast as a whole, and it is possible to widely reduce a generation of a defective unit.

In the heating cooker of the embodiment 3, the light emitting element (LED) is arranged on the operation substrate 25 which exists at the position in the inner side of the guide holder 37, and the light of the light emitting element irradiates the back surface of the operation switch region 124 on the top plate 22 through the light transmission portion 42a of the name plate 42 and the detection portion 36a of the electrode terminal portion 36. Accordingly, the operation switch region 124 becomes definite, and it is possible to prevent the pan or the like from being placed on the operation switch region 124 on the top plate 22 during the heating operation, which will otherwise reach a high temperature. Further, since it is configured such that the light transmits in the operation switch region 124 so as to emit light and display, the user can easily identify the operation switch region 124, and an improvement of an operability can be achieved.

As mentioned above, the heating cooker of the embodiment 3 is configured such that the light from the light emitting element irradiates the back surface of the operation switch region 124 on the top plate 22 through the light transmission portion 42a of the name plate 42. Accordingly, an individual simple character shape indicating the operation content securely appear in the operation switch region 124. Since the name plate 42 having the light transmission portion 42a is provided in the electrode terminal portion 36 as mentioned above, the user can more easily identify the operation content.

Further, in the heating cooker of the embodiment 3, the name plate 42 having the individual simple character shaped light transmission portion 42a indicating the operation content is attached to the top surface of the guide holder 37. Further, the name plate 42 is arranged within the electrode terminal portion 36, and it is configured such that the character shape of the light transmission portion 42a of the name plate 42 appears from the opening 36d of the detection portion 36a of the electrode terminal portion 36. The name plate 42 is arranged so as to have a gap with respect to the back surface of the top plate 22, and the operation substrate 25 is arranged in a lower side of the name plate 42. Accordingly, a heat transfer from the top plate 22 which reaches a high temperature by placing the cooking container such as the pan or the like, serving as the object to be heated, thereon is shut off to some extent by the name plate 42, and it is possible to reduce a heat influence by the heated object with respect to the operation substrate 25.

In the heating cooker of the embodiment 3, the opening 36d in a complex shape putting together a plurality of simple character shapes indicating the operation contents is formed in the detection portion 36a which is formed in the top surface of the electrode terminal portion 36. Accordingly, a shape of the opening 36d of the detection portion 36a through which the light from the light emitting element passes is set as small as possible. As a result, it is possible to make an area of the detection surface of the detection portion 36a relatively large. Therefore, the detection portion 36a can largely receive the change of the electrostatic capacity which serves as the touch switch, and an operability thereof is improved.

In other words, in the detection portion, in order to largely receive the change of the electrostatic capacity, a predetermined area or more is necessary as the detection surface of the detection portion, however, since the detection surface is reduced by forming the opening in the detection portion, it becomes hard to detect the change of the electrostatic capacity.

Accordingly, a smaller opening of the detection portion is preferable, however, if the opening is made smaller, the character shape to be formed in the name plate becomes smaller, and a visibility is deteriorated. On the other hand, if the detection surface of the detection portion is formed large without making the opening small, the operation portion becomes large, and it becomes hard to provide a plurality of operation portions.

Accordingly, in the heating cooker of the embodiment 3, the shape of the opening 36d of the detection portion 36a is formed as small as possible so that the light of the light emitting element passes through the character shaped light transmission portion 42a of the name plate 42 and passes through the detection portion 36a, by forming the opening 36d in a complex shape putting together a plurality of simple character shapes indicating the operation content in the detection portion 36a. Accordingly, since the heating cooker of the embodiment 3 is configured such that it can largely receive the change of the electrostatic capacity, it becomes easy to form the detection surface having a predetermined area or more in the detection portion 36a. As a result, in the configuration of the heating cooker of the embodiment 3, it is not necessary to form the operation portion 34 large in order to achieve an improvement of the operability, and it is possible to design the operation portion 34 compact.

Further, in the heating cooker of the embodiment 3, since it is configured to display the operation content by changing the color generation of the light emitting element in correspondence to the state of the heating cooker, it is possible to improve an optical visibility with respect to the user and a further improvement is intended in a usability.

Further, in the heating cooker of the embodiment 3, the light shielding portion 40 is provided in each of the electrode portions 34a and 34b of the operation portion 34, the light shielding portion 40 is arranged so as to have a predetermined distance from the detection portion 36a of the electrode terminal portion 36, and it is configured to move upward and downward together with the detection portion 36a. When the top plate 22 is mounted and fixed to the main body 21, the detection portion 36a of the electrode terminal portion 36 expands and contracts in the upward and downward direction by the spring portion 36b, and stably and securely contacts closely to the back surface of the operation switch region 124 on the top plate 22. As mentioned above, since the detection portion 36a of the electrode terminal portion 36 contacts closely to the back surface of the top plate 22, the distance between the back surface of the top plate 22 and the light shielding portion 40 can be always constant.

In other words, if the distance is set between the back surface of the top plate 22 and the light shielding portion 40 so as to prevent the light of the light emitting element from leaking to the other regions, it is possible to configure to prevent the light from leaking to the other regions than the specific region to be irradiated, with a simple configuration and at a low cost. In the heating cooker of the embodiment 3, since the light shielding portion 40 is provided in each of the electrode portions 34a and 34b of the operation portion 34, the light does not leak to the other regions than the specific region to be irradiated by the light, it is possible to prevent an outer appearance from being deteriorated as a product having no good appearance quality, and there is no fear that an erroneous operation is caused.

Further, in the heating cooker of the embodiment 3, it is configured such that the light shielding portion 40 is retained in a pinching manner by the electrode terminal portion 36 by setting the engagement portion 41 in the side surfaces which are formed in both sides of the detection portion 36a of the electrode terminal portion 36, and both the side surfaces of the light shielding portion 40 which are opposed to the side surfaces of the electrode terminal portion 36. Accordingly, by the provision of the engagement portion 41 having a simple configuration, it is possible to integrate the light shielding portion 40 and the electrode terminal portion 36, and it is possible to make the positions of the detection portion 36a of the electrode terminal portion 36 and the light shielding portion 40 always constant.

In the heating cooker of the embodiment 3, it is configured such that the electrode terminal portion 36 and the light shielding portion 40 integrally move by the engagement portion 41, and both the side surfaces of the electrode terminal portion 36 retain in a pinching manner the light shielding portion 40 so as to guide. Accordingly, there is no fear that the light shielding portion 40 deviates with respect to the electrode terminal portion 36, and it is always arranged at a predetermined position.

Further, in the heating cooker of the embodiment 3, it is configured such that the electrode terminal portion 36 is integrated with the light shielding portion 40. The electrode terminal portion 36 which is formed in the complicated shape by the metal thin plate while having the spring portion 36b of the elastic body is a delicate part which should be carefully handled. However, since the electrode terminal portion 36 is integrated with the light shielding portion 40, it becomes strong in its configuration and becomes easy in handling, and it is possible to improve a handling performance upon assembling or the like.

Embodiment 4

Figure 14:
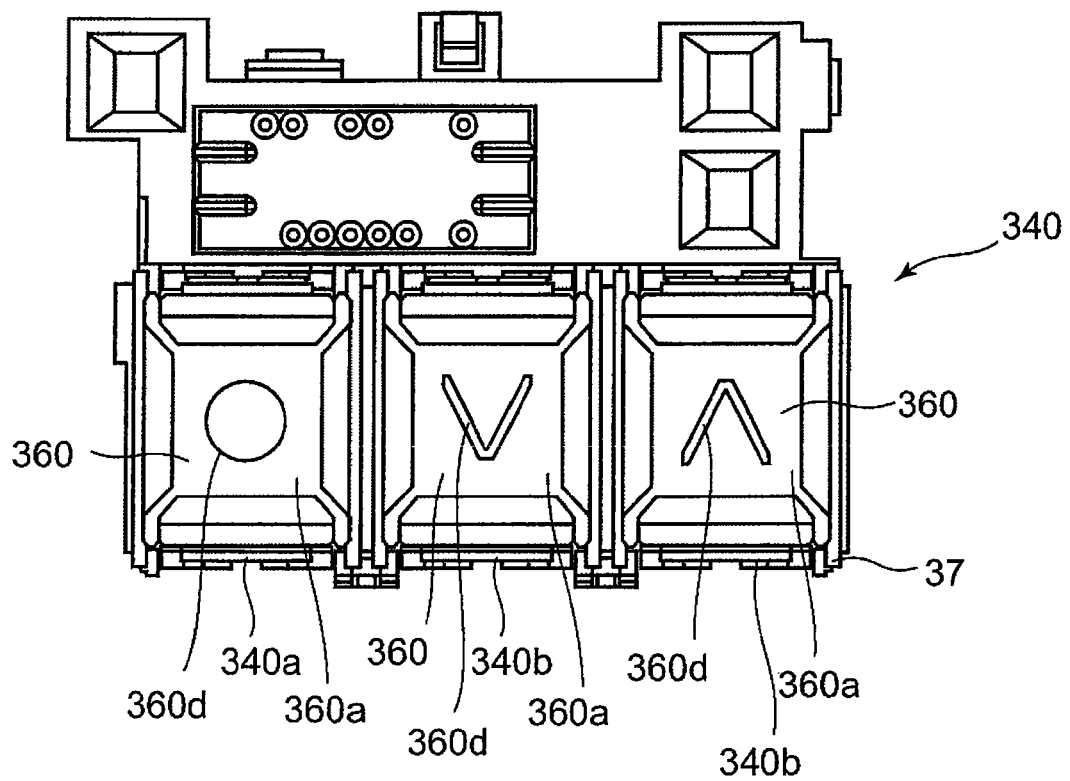
FIG. 14 is a plan view showing a configuration of an operation portion in a heating cooker of an embodiment 4 according to the present invention.

A description will be given below of a heating cooker of an embodiment 4 according to the present invention with reference to the accompanying FIG. 14. FIG. 14 is a plan view showing a configuration of an operation portion 340 which serves as an operation device in the heating cooker of the embodiment 4 according to the present invention. In the heating cooker of the embodiment 4, a different point from the heating cooker of the embodiment 3 mentioned above is a configuration of the operation portion 340, and the other configurations are the same as the heating cooker of the embodiment 3. In the heating cooker of the embodiment 4, a detection portion 360a of an electrode terminal portion 360 has a character shaped opening 360d. In the description of the embodiment 4, the same reference numerals are attached to the elements having the same functions and configurations as the heating cooker of the embodiment 3 mentioned above and a description thereof will be omitted.

The electrode terminal portion 360 in the heating cooker of the embodiment 4 is provided with a detection portion 360a which comes into close contact with the back surface of the top plate 22 (the operation switch region 124), a slide portion 360c which is integrally formed with the detection portion 360a and slidably engages with the guide holder 37, and a spring portion 360b which has an elastic force pressing the detection portion 360a so as to come into close contact with the top plate 22, and is fixed in its one end to the guide holder 37, in the same manner as the electrode terminal portion 36 in the heating cooker of the embodiment 3 mentioned above. Accordingly, the detection portion 360a is pressed against the back surface of the top plate 22 due to the elastic force of the spring portion 360b which is supported on both sides of the detection portion 360a. In the embodiment 4, the spring portion 360b and the slide portion 360c in the electrode terminal portion 360 have the same configurations as the spring portion 36b and the slide portion 36c of the electrode terminal portion 36 in the embodiment 3, and have the same functions (refer to FIG. 10).

As shown in FIG. 14, the simple character shaped opening 360d indicating the operation content of the electrostatic touch switch is formed in the detection portion 360a which is formed in the top surface of the electrode terminal portion 360.

A description will be given further in detail of the character shape which is formed in the detection portion 360a of the electrode terminal portion 360.

In the operation portion 340, the operation switch electrode portion 340a is an electrostatic touch switch for carrying out an on and off control of the heating operation. The circular opening 360d is formed in a simple character shape indicating the operation content of the electrostatic touch switch, in the detection portion 360a of the electrode terminal portion 360 in the operation switch electrode portion 340a. Further, in two calorie operation switch electrode portions 340b and 340b arranged side by side, the calorie operation switch electrode 340b in a right side of FIG. 14 is an electrostatic touch switch which is used for raising a heating calorie, and an inverted-V shaped opening 360d is formed in the detection portion 360a. On the other hand, the calorie operation switch electrode portion 340b in a left side of FIG. 14 is an electrostatic touch switch which is used for reducing the heating calorie, and a V-shaped opening 360d is formed in the detection portion 360a.

Further, in the heating cooker of the embodiment 4, since it is configured such that the simple character shaped opening 360d indicating the operation content is formed in the detection portion 360a which is formed in the top surface of the electrode terminal portion 360, the name plate indicating the individual simple character shape indicating the operation content is not necessary. As a result, the heating cooker of the embodiment 4 is simple in its configuration in comparison with the heating cooker of the embodiment 3, and the configuration for preventing the displacement of the name plate with respect to the detection portion 360a of the electrode terminal portion 360 or the like is not necessary.

Further, in the heating cooker of the embodiment 4, since the detection portion 360a which is formed in the top surface of the electrode terminal portion 360 contacts closely to the back surface of the operation switch region 124 on the top plate 22, the light passing through the character shaped opening 360d which is formed in the detection portion 360a directly irradiates the back surface of the operation switch region 124. In other words, the light passing through the character shaped opening 360d which is formed in the detection portion 360a is not affected by a shadow or the like of a peripheral structure. Accordingly, in the heating cooker of the embodiment 4, since it has no chip of the character shape which tends to be generated at a time when the user views from a diagonal direction, and the definite character shape is displayed in the operation switch region 124, a visibility is improved.

Embodiment 5

Figure 15:
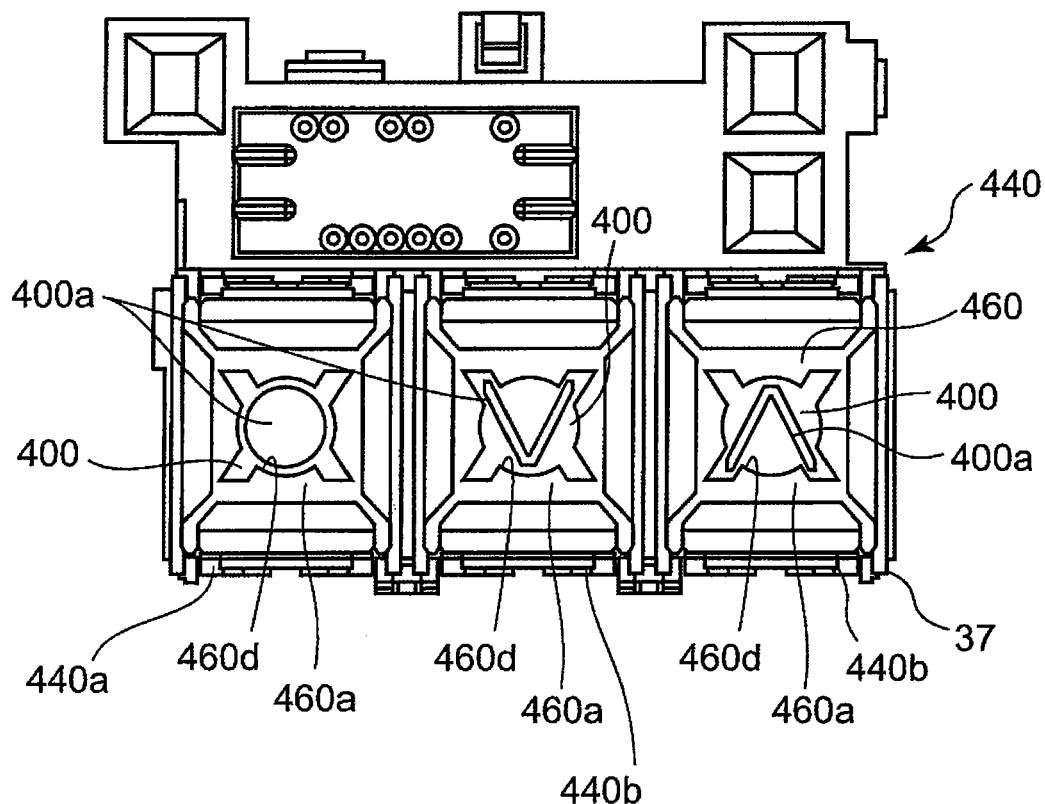
FIG. 15 is a plan view showing a configuration of an operation portion in a heating cooker of an embodiment 5 according to the present invention.
Figure 16:
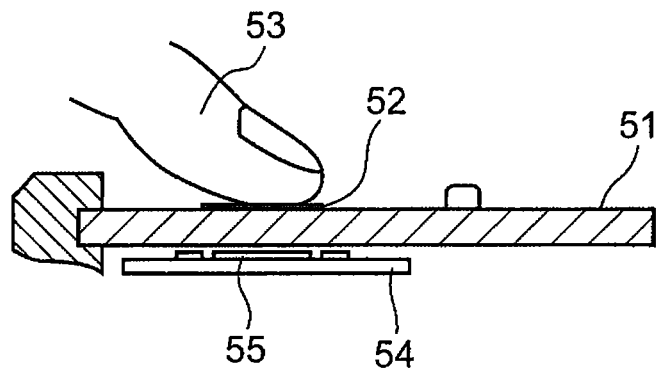
FIG. 16 is the cross sectional view showing the electrostatic touch switch in the conventional heating cooker.
Figure 17:
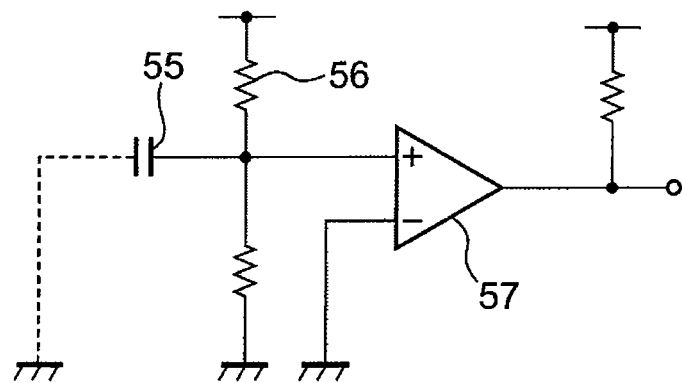
FIG. 17 is the electric circuit diagram showing the operation switch and the detection circuit in the conventional heating cooker shown in FIG. 16.
Figure 18:
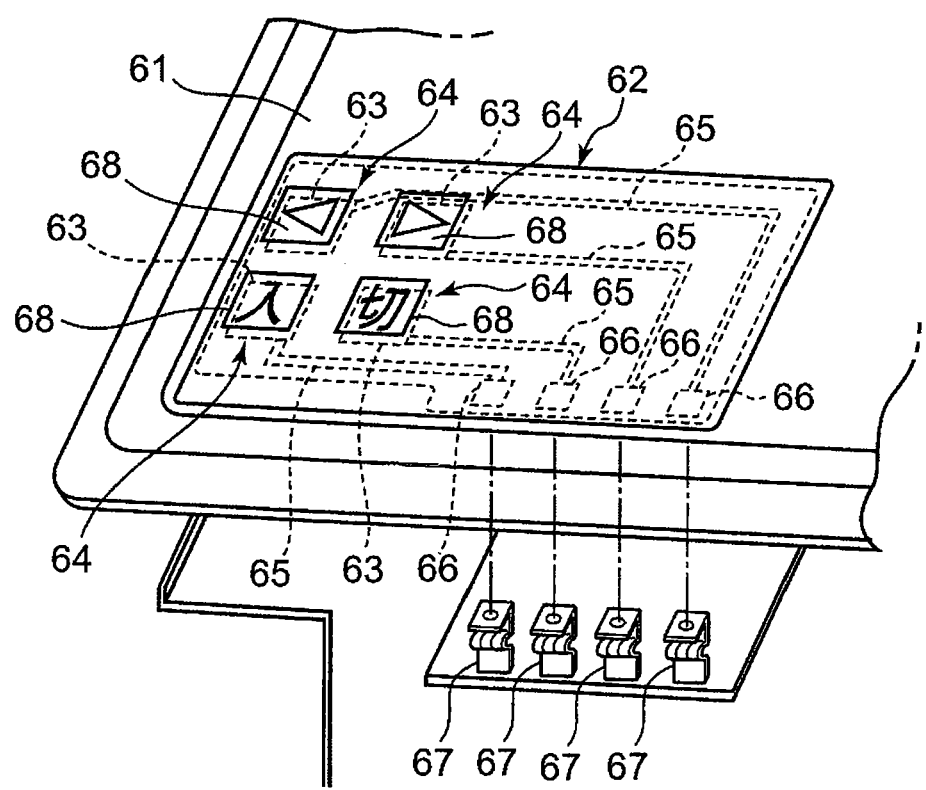
FIG. 18 is the exploded perspective view showing in the enlarged manner the periphery of the operation switch region in the conventional heating cooker.
Figure 19:
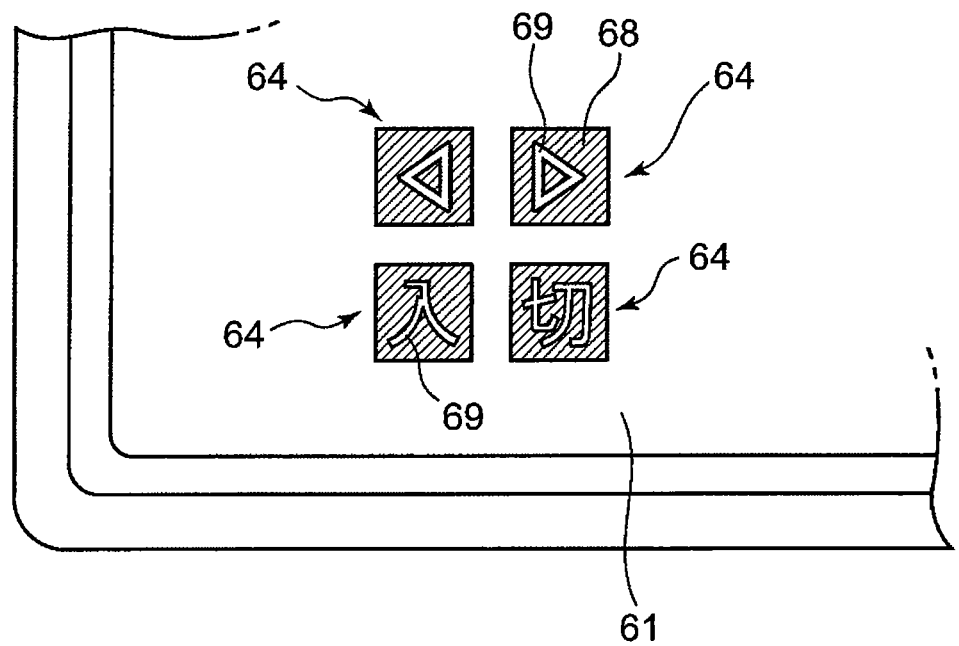
FIG. 19 is the plan view showing the touch switch in the operation switch region in the conventional heating cooker.
Figure 20:
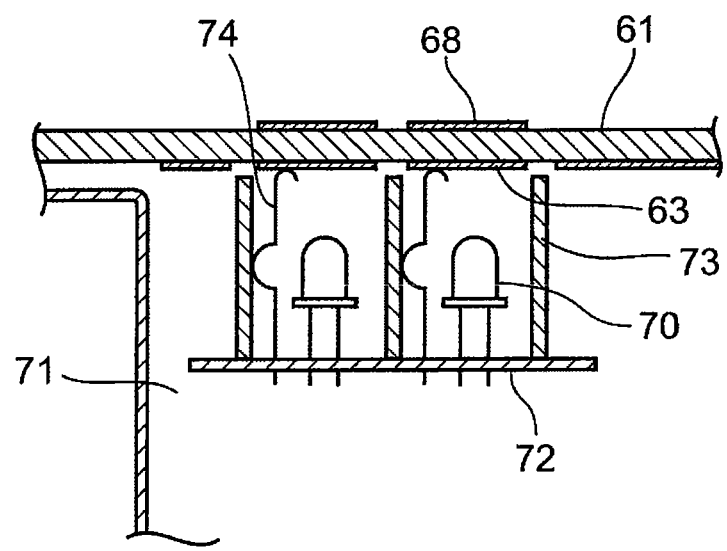
FIG. 20 is the cross sectional view of the substantial part in the touch switch of the conventional heating cooker.

A description will be given below of a heating cooker of an embodiment 5 according to the present invention with reference to the accompanying FIG. 15. FIG. 15 is a plan view showing a configuration of an operation portion 440 in the heating cooker of the embodiment 5 according to the present invention. In the heating cooker of the embodiment 5, a different point from the heating cooker of the embodiment 3 mentioned above is a configuration of the operation portion 440 which serves as an operation device, and the other configurations are the same as the heating cooker of the embodiment 3. In the heating cooker of the embodiment 5, a light shielding portion 400 has a character shaped opening 400a, and an opening 460d in a complex shape putting together simple character shapes indicating the operation contents of the electrostatic touch switch is formed in a detection portion 460a of an electrode terminal portion 460. In the description of the embodiment 5, the same reference numerals are attached to the elements having the same functions and configurations as the heating cooker of the embodiment 3 mentioned above and a description thereof will be omitted.

The electrode terminal portion 460 in the heating cooker of the embodiment 5 is provided with a detection portion 460a which comes into close contact with the back surface of the top plate 22, a slide portion 460c which is integrally formed with the detection portion 460a and slidably engages with the guide holder 37, and a spring portion 460b which has an elastic force pressing the detection portion 460a so as to come into close contact with the top plate 22, and is fixed in its one end to the guide holder 37, in the same manner as the electrode terminal portion 36 in the heating cooker of the embodiment 3 mentioned above. Accordingly, the detection portion 460a is pressed against the back surface of the top plate 22 due to the elastic force of the spring portion 460b which is sup-ported on both sides of the detection portion 460a. In the embodiment 5, the spring portion 460b and the slide portion 460c in the electrode terminal portion 460 have the same configurations as the spring portion 36b and the slide portion 36c of the electrode terminal portion 36 in the embodiment 3, and have the same functions (refer to FIG. 10).

As shown in FIG. 15, as shown in the heating cooker of the embodiment 5, the simple character shaped opening 400a indicating the operation content is formed in the top surface of the light shielding portion 400. The light shielding portion 400 is formed in its side surface by a rectangular frame body and is provided with a top plate in which the opening 400a is formed in its top surface. Further, in the heating cooker of the embodiment 5, the opening 460d in a complex shape putting together a plurality of simple character shapes indicating the operation contents is formed in the detection portion 460a which is formed in the top surface of the electrode terminal portion 460.

In the heating cooker of the embodiment 5, since it is configured such that the simple character shaped opening 400a indicating the operation content is formed on the top plate of the light shielding portion 400, the name plate indicating the individual simple character shape indicating the operation content is not necessary. As a result, the heating cooker of the embodiment 5 is simple in its configuration in comparison with the heating cooker of the embodiment 3, and the configuration for preventing the displacement of the name plate with respect to the light shielding portion 400 or the like is not necessary.

In the heating cooker of the embodiment 4 mentioned above, it is necessary to form the character shaped opening 360d in the electrode terminal portion 360 which has the spring portion of the elastic material, has a complex shape by the metal thin plate and should be carefully handled, and manufacture the plural kinds of electrode terminal portions 360 having the different character shapes. However, in the heating cooker of the embodiment 5, since the light shielding portion 400 is a resin molded product, it is possible to simultaneously produce the plural kinds of light shielding portions 400 having the simple character shaped openings 400a indicating the operation contents on the top plate of the light shielding portion 400, by one metal mold. Accordingly, the heating cooker of the embodiment 5 can widely reduce a manufacturing cost, and can be easily handled as well as a parts number is reduced and a configuration becomes simple, so that a productivity is widely improved.

Further, in the heating cooker of the embodiment 5, since the light shielding portion 400 is configured by the resin molded part, a heat capacity is larger than the thin plate shaped name plate which is used in the embodiment 3 mentioned above, and a mechanical strength at a high temperature time is higher than the name plate made of the same material. Accordingly, the heat transfer from the top plate 22, which allows the cooking container such as the pan or the like, serving as the object to be heated, to be placed thereon and thus reaches a high temperature, is widely shut off by the light shielding portion 400, and it is possible to reduce an influence of the heat from the heated object with respect to the operation substrate 25.

The operation device of the present invention is the operation device which is made of the dielectric material, is arranged just below the operation region on the top plate made of the material having the electric insulating property, and has the electrode terminal portion serving as the electrostatic capacity type touch switch, the guide holder slidably retaining the electrode terminal portion, and the operation substrate provided with the guide holder, as described by the example which is used in the heating cooker in each of the embodiments mentioned above. In this operation device, the electrode terminal portion has the detection portion which comes into close contact with the back surface of the operation region, the spring portion which has the elastic force pressing the detection portion to the back surface of the operation region, and the slide portion which is movably retained to the guide holder, moves together with the detection portion due to the elastic force of the spring portion, and presses the detection portion to the back surface of the operation region. Further, the operation device of the present invention is configured such that the detection portion, the spring portion and the slide portion are integrally formed, and the change of the electrostatic capacity in the electrode terminal portion is output as the operation signal.

In the operation device of the present invention which is configured as mentioned above, the slide portion of the electrode terminal portion is movably retained by the guide holder, and the detection portion of the electrode terminal portion expands and contracts due to the elastic force by the spring portion, and stably and securely contacts closely to the back surface of the operation region on the top plate. Accordingly, when the top plate is mounted on the main body upon assembling and maintenance, the distance between the detection portion of the electrode terminal portion and the back surface of the top plate does not vary.

Further, in the operation device of the present invention, the detection of the user's operation is carried out by the electrostatic capacity type touch switch, and it is configured to convert the change of the electrostatic capacity in the detection portion of the electrode terminal portion which is generated by the user touching the operation switch region (the operation region) on the top plate as the operation signal. The control portion controls the heating unit or the like in accordance with the predetermined sequence based on the input operation signal. Since the user can operate in the operation switch region on the top plate, an operability is high and it is easy to handle. Further, in accordance with the operation device of the present invention, since the projection or the dent such as the button or the like does not exist in the operation switch region, it is possible to provide the operation portion which is easily cleaned up, is user friendly and has an excellent design property.

Further, since the operation device of the present invention can stably and securely contacts closely to the detection portion of the electrode terminal portion and the back surface of the operation switch region (the operation region) on the top plate, there is no dispersion upon assembling and maintenance, and it is possible to obtain a stable operation feeling. Further, in the operation device of the present invention, since the electrode terminal portion having the detection portion, the spring and the slide portion is integrally formed, there is no dispersion of the contact resistance in the electrode terminal portion, and a stable operation feeling can be obtained with age.

In this case, in the operation device of the present invention, the description is given of the example in which the individual simple character shape indicating the operation content of the touch switch is formed in the name plate (30, 42), the detection portion (260*a*, 360*a*) or the light shielding portion (400), as described in each of the embodiments mentioned above, however, the operation device of the present invention includes any configuration, and a desired configuration is appropriately selected while taking into consideration a processing easiness or the like in correspondence to the character shape to be formed.

Further, in the operation device of the present invention, it may be configured such that the diffusion sheet which diffuses the light is attached to the top surface of the guide holder which slidably retains the electrode terminal portion. Since the light from the LED serving as the light emitting element is diffused in the diffusion sheet, passes through the opening of the detection portion and uniformly irradiates the back surface of the operation switch region, by attaching the diffusion sheet as mentioned above, a uniformity of the lighting portion indicating the character shape is improved, and a further definite display can be carried out with respect to the user. In this case, the position to attach the diffusion sheet is not limited to the position mentioned above, but may be set to any position where the light from the character shape in the operation portion uniformly is applied in the operation switch region.

Further, in the operation device of the present invention, it may be configured such that a part or all of the individual simple character shape indicating the operation content of the touch switch is printed on the back surface of the top plate. In the configuration mentioned above, it is necessary to arrange such that the opening of the detection portion of the electrode terminal portion corresponds to the position of the character which is printed on the top plate, however, it is possible to achieve such a configuration that can correspond to variously complex character shapes.

Further, in the operation device of the present invention, it may be configured such that a conductive sheet having the individual simple character shaped light transmission portion indicating the operation content of the touch switch is attached to the detection portion which has the opening of the electrode terminal portion. In the configuration mentioned above, it is possible to configure such that the conductive sheet which is integrated with the detection portion of the electrode terminal portion has a detecting function. Accordingly, it is possible to easily make an area of the detection portion equal to or more than a predetermined area, so as to largely receive the change of the electrostatic capacity in the electrode terminal portion. Further, since the conductive sheet which is integrated with the detection portion sticks to the back surface of the operation switch region on the top plate, it is not affected by a peripheral structure of the operation portion or the like. As a result, any shadow is not formed in the operation switch region, it has no chip of the character shape which tends to be generated when viewed from a diagonal direction, and a visibility is widely improved.

The operation device of the present invention has a stable operation feeling with a simple configuration, and has an excellent operability and a high reliability at a low cost. In the operation device of the present invention, the slide portion of the electrode terminal portion is movably retained by the guide holder, and the detection portion of the electrode terminal portion expands and contracts due to the elastic force by the spring portion, and stably and securely contacts closely to the back surface of the operation region on the top plate. Accordingly, when the top plate is mounted on the main body upon assembling and maintenance, the distance between the detection portion of the electrode terminal portion and the back surface of the top plate does not vary, but becomes constant, and the detecting function as the electrostatic capacity type touch switch is uniformized.

Further, in the operation device of the present invention, the operation state of the user is detected by the electrostatic capacity type touch sensor, and it is configured to convert the change of the electrostatic capacity in the detection portion of the electrode terminal portion which is generated by the user touching the operation switch region (the operation region)

on the top plate, as the operation signal. The control portion controls the heating unit or the like in accordance with the predetermined sequence based on the input operation signal. Since the user can operate in the operation switch region on the top plate, an operability is high and it is easy to handle. Further, according to the present invention, since the operation switch region is not provided with the projection and the dent such as the button or the like, it is possible to provide the operation portion which is easy to clean up, is user friendly and has an excellent design property.

Further, in the operation device of the present invention, since the detection portion of the electrode terminal portion can stably and securely contacts closely to the back surface of the operation switch region (the operation region) on the top plate, it is possible to provide a stable operation feeling without dispersion upon assembling and maintenance. Further, in the operation device of the present invention, since the electrode terminal portion having the detection portion, the spring portion and the slide portion is integrally formed, there is no dispersion of the contact resistance in the electrode terminal portion, and a stable operation feeling having no deterioration with age can be obtained for a long period.

According to the operation device of the present invention, by using the electrostatic capacity type touch switch as the operation device in the various equipment, it is possible to provide the equipment in which the operation feeling in the various equipment becomes stable, a design property is high, a high appearance quality is obtained, and a manufacturing cost can be held down to a low cost, and it is possible to configure the equipment which has a further high reliability and has an excellent operability.

INDUSTRIAL APPLICABILITY

Since the operation device of the present invention can obtain the stable operation feeling, has the simple configuration and is easily handled upon assembling, it can be applied generally to the equipment having the operation portion which is provided as the electrostatic capacity type touch switch.

The invention claimed is:
1. An operation device comprising:
an operation region on a top plate made of a material having an electric insulating property;
an electrode terminal portion which is arranged just below the operation region, and serves as an electrostatic capacity type touch switch;
a guide holder which slidably holds the electrode terminal portion; and
an operation substrate which is provided with the guide holder,
wherein the electrode terminal portion has:
a detection portion which comes into close contact with a back surface of the operation region,
a spring portion which has an elastic force pressing the detection portion to the back surface of the operation region, and
a slide portion which is movably retained in the guide holder, moves together with the detection portion due to the elastic force of the spring portion, and presses the detection portion to the back surface of the operation region, and
wherein the detection portion, the spring portion and the slide portion are integrally formed, and a change of an electrostatic capacity in the electrode terminal portion is configured to be output as an operation signal.

2. The operation device as claimed in claim 1, wherein the detection portion of the electrode terminal portion has a flat surface which is in parallel to the back surface of the operation region on the top plate, and forms a top surface of the electrode terminal portion, and
wherein the spring portion and the slide portion are formed in each of both side surfaces of the electrode terminal portion so as to support both sides of the detection portion, and the slide portion is movably retained in the guide holder at a time when the slide portion and the detection portion move due to the elastic force of the spring portion, and the detection portion comes into contact with the back surface of the top plate.

3. The operation device as claimed in claim 1, wherein the guide holder is configured such that a hole having an opening is formed in the top surface which is located at a position opposed to the back surface of the top plate, a light emitting element is arranged in the hole of the guide holder, a light from the light emitting element irradiates the detection portion of the electrode terminal portion, and the light transmits from at least a part of the operation region on the top plate.

4. The operation device as claimed in claim 3, wherein a light shielding portion is provided between the detection portion of the electrode terminal portion and the guide holder, and the light shielding portion is movably retained to the guide holder, and moves together with the detection portion.

5. The operation device as claimed in claim 3, wherein a name plate having an individual simple character shaped light transmission portion indicating an operation content of a touch switch is attached to the top surface opening of the guide holder, the name plate is irradiated by the light from the light emitting element in the hole of the guide holder, and the character shape of the light transmission portion is displayed in the operation region on the top plate through the opening which is formed in the detection portion of the electrode terminal portion.

6. The operation device as claimed in claim 3, wherein a simple character shaped opening indicating the operation content is formed in the detection portion which is formed in the top surface of the electrode terminal portion.

7. The operation device as claimed in claim 3, wherein the light emitting element is configured by arranging a plurality of LED which generate a plurality of colors, or LED which generate different colors, and is configured to change the color generation of the light emitting element in correspondence to an operation state by the operation of the touch switch.

8. The operation device as claimed in claim 3, wherein a diffusion sheet diffusing the light is attached to the top surface of the guide holder.

9. The operation device as claimed in claim 3, wherein an individual character shape indicating the operation content of the touch switch is printed to the back surface of the operation region on the top plate.

10. The operation device as claimed in claim 3, wherein a conductive sheet having an individual character shaped light transmission portion indicating the operation content of the touch switch is attached to the detection portion.

11. The operation device as claimed in claim 4, wherein the light shielding portion and the electrode terminal portion is configured to be connected by an engagement portion so as to integrally move, and the electrode terminal portion is configured to pinch the light shielding portion.

12. The operation device as claimed in claim 4, wherein simple character shaped opening indicating the operation content of the touch switch is formed on the top plate of the light shielding portion.

13. The operation device as claimed in claim 5, wherein an opening in a complex shape putting together a plurality of simple character shapes indicating the operation contents of the touch switch is formed in the detection portion which is formed in the top surface of the electrode terminal.

14. The operation device as claimed in claim 1 for use in a heating cooker, wherein the heating cooker comprises:
 a heating unit which is provided just below the top plate and heats an object to be heated placed on the top plate; and
 a control portion which controls the heating unit,
 wherein it is configured such that an operation signal in response to a change of an electrostatic capacity in the electrode terminal portion of the operation device is input to the control portion so as to control the heating unit.

15. The operation device as claimed in claim 2 for use in a heating cooker, wherein the heating cooker comprises:
 a heating unit which is provided just below the top plate and heats an object to be heated placed on the top plate; and
 a control portion which controls the heating unit,
 wherein it is configured such that an operation signal in response to a change of an electrostatic capacity in the electrode terminal portion of the operation device is input to the control portion so as to control the heating unit.

16. The operation device as claimed in claim 3 for use in a heating cooker, wherein the heating cooker comprises:
 a heating unit which is provided just below the top plate and heats an object to be heated placed on the top plate; and
 a control portion which controls the heating unit,
 wherein it is configured such that an operation signal in response to a change of an electrostatic capacity in the electrode terminal portion of the operation device is input to the control portion so as to control the heating unit.

17. The operation device as claimed in claim 4 for use in a heating cooker, wherein the heating cooker comprises:
 a heating unit which is provided just below the top plate and heats an object to be heated placed on the top plate; and
 a control portion which controls the heating unit,
 wherein it is configured such that an operation signal in response to a change of an electrostatic capacity in the electrode terminal portion of the operation device is input to the control portion so as to control the heating unit.

18. The operation device as claimed in claim 5 for use in a heating cooker, wherein the heating cooker comprises:
 a heating unit which is provided just below the top plate and heats an object to be heated placed on the top plate; and
 a control portion which controls the heating unit,
 wherein it is configured such that an operation signal in response to a change of an electrostatic capacity in the electrode terminal portion of the operation device is input to the control portion so as to control the heating unit.

19. The operation device as claimed in claim 6 for use in a heating cooker, wherein the heating cooker comprises:
 a heating unit which is provided just below the top plate and heats an object to be heated placed on the top plate; and
 a control portion which controls the heating unit,
 wherein it is configured such that an operation signal in response to a change of an electrostatic capacity in the electrode terminal portion of the operation device is input to the control portion so as to control the heating unit.

20. The operation device as claimed in claim 7 for use in a heating cooker, wherein the heating cooker comprises:
 a heating unit which is provided just below the top plate and heats an object to be heated placed on the top plate; and
 a control portion which controls the heating unit,
 wherein it is configured such that an operation signal in response to a change of an electrostatic capacity in the electrode terminal portion of the operation device is input to the control portion so as to control the heating unit.

21. The operation device as claimed in claim 8 for use in a heating cooker, wherein the heating cooker comprises:
 a heating unit which is provided just below the top plate and heats an object to be heated placed on the top plate; and
 a control portion which controls the heating unit,
 wherein it is configured such that an operation signal in response to a change of an electrostatic capacity in the electrode terminal portion of the operation device is input to the control portion so as to control the heating unit.

22. The operation device as claimed in claim 9 for use in a heating cooker, wherein the heating cooker comprises:
 a heating unit which is provided just below the top plate and heats an object to be heated placed on the top plate; and
 a control portion which controls the heating unit,
 wherein it is configured such that an operation signal in response to a change of an electrostatic capacity in the electrode terminal portion of the operation device is input to the control portion so as to control the heating unit.

23. The operation device as claimed in claim 10 for use in a heating cooker, wherein the heating cooker comprises:
 a heating unit which is provided just below the top plate and heats an object to be heated placed on the top plate; and
 a control portion which controls the heating unit,
 wherein it is configured such that an operation signal in response to a change of an electrostatic capacity in the electrode terminal portion of the operation device is input to the control portion so as to control the heating unit.

24. The operation device as claimed in claim 11 for use in a heating cooker, wherein the heating cooker comprises:
 a heating unit which is provided just below the top plate and heats an object to be heated placed on the top plate; and
 a control portion which controls the heating unit,
 wherein it is configured such that an operation signal in response to a change of an electrostatic capacity in the electrode terminal portion of the operation device is input to the control portion so as to control the heating unit.

25. The operation device as claimed in claim 12 for use in a heating cooker, wherein the heating cooker comprises:
 a heating unit which is provided just below the top plate and heats an object to be heated placed on the top plate; and
 a control portion which controls the heating unit,
 wherein it is configured such that an operation signal in response to a change of an electrostatic capacity in the electrode terminal portion of the operation device is input to the control portion so as to control the heating unit.

26. The operation device as claimed in claim 13 for use in a heating cooker, wherein the heating cooker comprises:
 a heating unit which is provided just below the top plate and heats an object to be heated placed on the top plate; and
 a control portion which controls the heating unit,
 wherein it is configured such that an operation signal in response to a change of an electrostatic capacity in the electrode terminal portion of the operation device is input to the control portion so as to control the heating unit.

\* \* \* \* \*